(12) United States Patent
Gibson et al.

(10) Patent No.: US 7,183,643 B2
(45) Date of Patent: Feb. 27, 2007

(54) STACKED PACKAGES AND SYSTEMS INCORPORATING THE SAME

(75) Inventors: David Gibson, Lake Oswego, OR (US); Andy Stavros, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 292 days.

(21) Appl. No.: 10/981,067

(22) Filed: Nov. 4, 2004

(65) Prior Publication Data
US 2005/0194672 A1    Sep. 8, 2005

Related U.S. Application Data

(60) Provisional application No. 60/517,179, filed on Nov. 4, 2003.

(51) Int. Cl.
*H01L 23/34* (2006.01)
(52) U.S. Cl. ..................... 257/723; 257/686
(58) Field of Classification Search ............. 257/723, 257/778, 685, 686
See application file for complete search history.

(56) References Cited

U.S. PATENT DOCUMENTS

| | | | |
|---|---|---|---|
| 4,956,694 A | 9/1990 | Eide | |
| 4,982,265 A | 1/1991 | Watanabe et al. | |
| 4,996,583 A | 2/1991 | Hatada | |
| 5,138,438 A | 8/1992 | Masayuki et al. | |
| 5,148,265 A | 9/1992 | Khandros et al. | |
| 5,220,804 A | 6/1993 | Tilton et al. | |
| 5,854,507 A | 12/1998 | Miremadi et al. | |
| 5,861,666 A | 1/1999 | Bellaar | |
| 6,072,233 A | 6/2000 | Corisis et al. | |
| 6,121,676 A | 9/2000 | Solberg | |
| 6,225,688 B1 | 5/2001 | Kim et al. | |
| 6,414,391 B1 * | 7/2002 | Corisis et al. | 257/738 |
| 6,447,270 B1 | 9/2002 | Schmidt et al. | |

(Continued)

FOREIGN PATENT DOCUMENTS

WO    WO-04/077525    9/2004

OTHER PUBLICATIONS

Fjelstad, U.S. Appl. No. 10/077,388, filed Feb. 15, 2002 (abandoned).

(Continued)

*Primary Examiner*—Roy Karl Potter
(74) *Attorney, Agent, or Firm*—Lerner, David, Littenberg, Krumholz & Mentlik, LLP

(57) ABSTRACT

A microelectronic assembly incorporates units stacked one above the other and may include a plurality of similar stacks mounted to a circuit board. Some of the stacks may be inverted, rotated or both relative to other stacks so that corresponding edges of the stacks face one another to facilitate communication between the stacks. Communication between the stacks may be carried along traces on one or more interposers intercepting the stacks remote from the circuit board. Within each stack, conducting paths may extend in vertical columns or in other arrangements such as a stair step arrangement wherein each conductive path traverses a series of column positions, or in a crossing arrangement such two conductive paths cross back and forth between column positions along the vertical extend of the stack. A stack may include portions disposed above and below the circuit board.

50 Claims, 13 Drawing Sheets

U.S. PATENT DOCUMENTS

| | | |
|---|---|---|
| 6,455,928 B2 | 9/2002 | Corisis et al. |
| 6,465,893 B1 | 10/2002 | Khandros et al. |
| 6,522,018 B1 | 2/2003 | Tay et al. |
| 6,555,918 B2 | 4/2003 | Masuda et al. |
| 6,560,117 B2 | 5/2003 | Moon |
| 6,765,288 B2 | 7/2004 | Damberg |
| 7,057,270 B2 * | 6/2006 | Moshayedi ............ 257/686 |
| 2002/0125571 A1 | 9/2002 | Corisis et al. |
| 2002/0153602 A1 | 10/2002 | Tay et al. |
| 2003/0107118 A1 | 6/2003 | Pflughaupt et al. |
| 2003/0164540 A1 | 9/2003 | Lee et al. |
| 2004/0031972 A1 | 2/2004 | Pflughaupt et al. |
| 2005/0173805 A1 | 8/2005 | Damberg et al. |
| 2005/0181544 A1 | 8/2005 | Haba et al. |
| 2005/0181655 A1 | 8/2005 | Haba et al. |

OTHER PUBLICATIONS

Haba et al., U.S. Appl. No. 11/140,312, filed May 27, 2005.

* cited by examiner

US 7,183,643 B2

STACKED PACKAGES AND SYSTEMS INCORPORATING THE SAME

CROSS-REFERENCE TO RELATED APPLICATIONS

This application claims the benefit of the filing date of U.S. Provisional Patent Application No. 60/517,179, filed Nov. 4, 2003, the disclosure of which is hereby incorporated by reference herein.

FIELD OF THE INVENTION

The present invention relates to microelectronic packaging and systems.

BACKGROUND OF THE INVENTION

Microelectronic elements such as semiconductor chips are commonly provided in packages having terminals connected to the microelectronic element itself, such terminals being available for connection to external elements such as printed circuit boards.

Some microelectronic elements, notably memory chips, have been provided heretofore in stacked arrangements with packages superposed one atop the other to conserve space on a circuit board. Such structures typically involve only a few chips and relatively simple connections which normally do not involve interconnections between chips in the stack, or between multiple stacks of chips. Even in these situations, it is sometimes necessary to provide different packages for different chips in the stack.

SUMMARY OF THE INVENTION

One aspect of the present invention provides a stacked packaging arrangement especially useful for, e.g., logic chips such as field programmable gate arrays (hereinafter "FPGA") or microprocessors, in which the stacked packaging arrangement accommodates logical interconnections between chips where inputs from one chip are connected to outputs of other chips. A further aspect of the invention provides designs for individual units and elements which can be used in such stacked arrangement. Yet another aspect of the invention provides a system-level design which allows for integration of multiple stacked packages while minimizing the complexity of signal routing in a printed circuit board ("PCB") or other circuit panel used in the system. Still other aspects of the invention provide unit configurations which facilitate routing of signals to chips on different packages in a stack.

DETAILED DESCRIPTION

Figure 1:
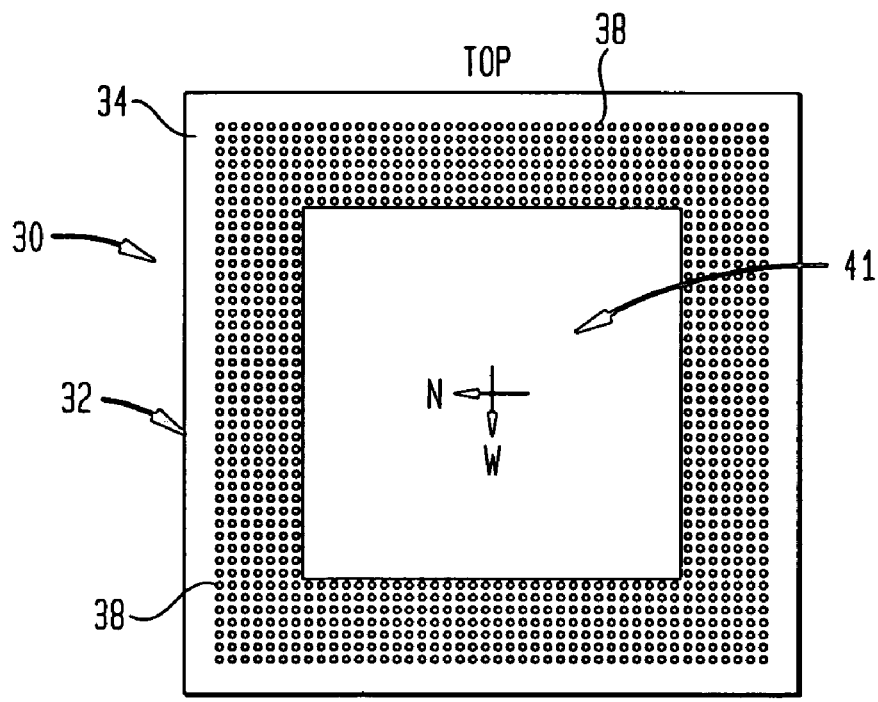
FIG. 1 is a diagrammatic top plan view of a unit in accordance with one embodiment of the invention.
Figure 2:
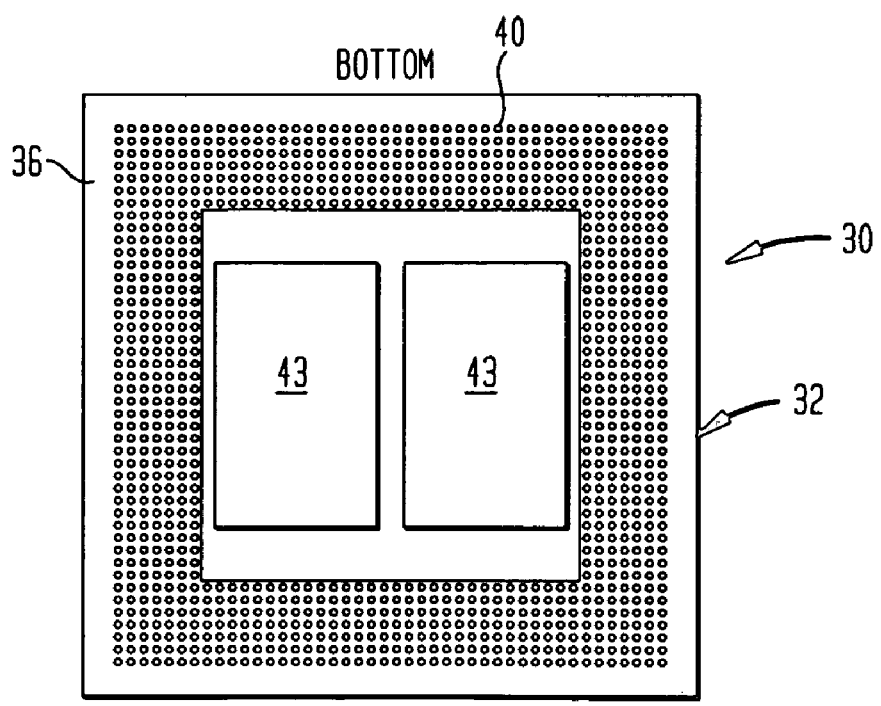
FIG. 2 is a diagrammatic bottom plan view of the unit shown in FIG. 1.

A system according to one embodiment of the invention uses a plurality of units 30 (FIGS. 1 and 2). Each unit includes a unit substrate 32 in the form of a dielectric element such as a circuit board or flexible circuit panel, commonly referred to as a "tape." The unit substrate defines a top side 34 (FIG. 1) and a bottom side 36 (FIG. 2). Each unit substrate has top unit terminals 38 exposed at the top side of the unit and bottom unit terminals 40 exposed at its bottom side.

Each unit also includes a first microelectronic element in the form of a semiconductor chip 41, in this case, an FPGA. In the particular design illustrated, each unit also includes additional semiconductor chips or SRAMs 43. The SRAM within each unit cooperates with the FPGA of that particular unit. In the embodiment illustrated, the FPGA chip is flip-chip mounted to the top of the unit substrate, so that the unit substrate serves as the package for the FPGA. The SRAMs are supplied in separate chip size packages, which are LGA-bonded to the bottom side of the unit substrate. Any other chip mounting techniques can be used.

Figure 3:
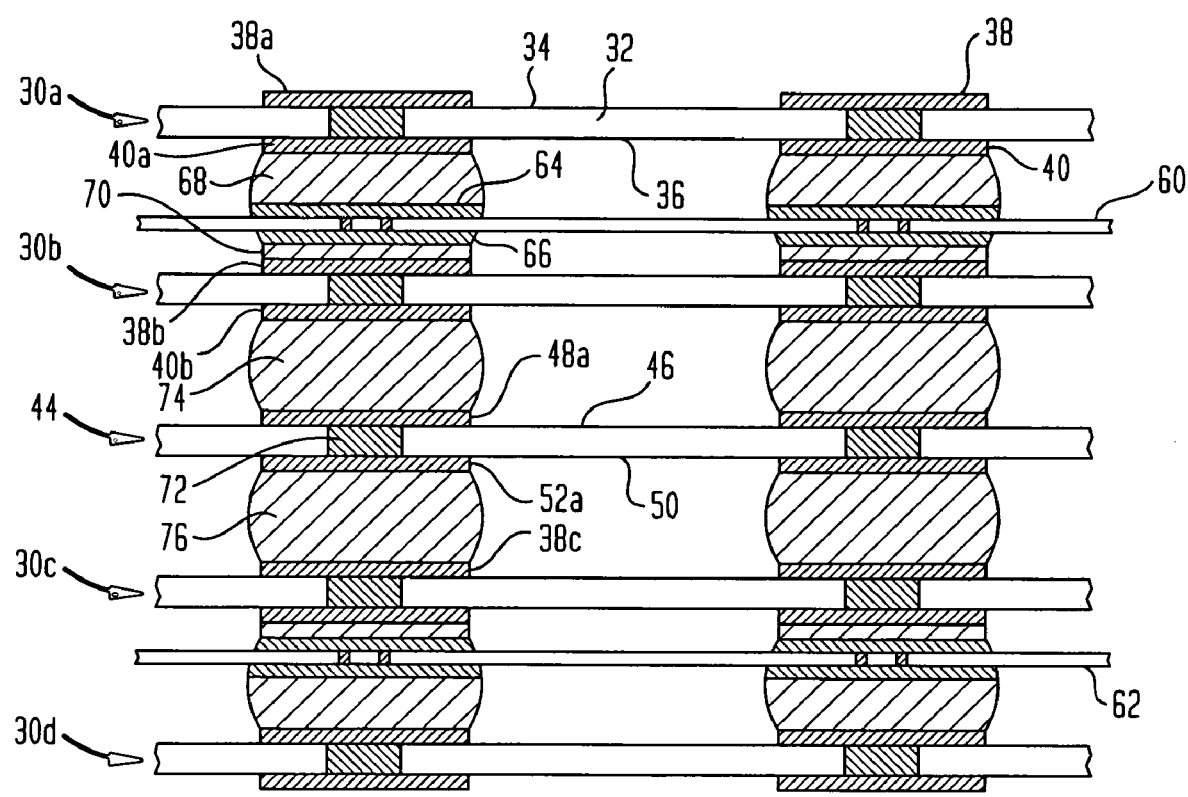
FIG. 3 is a fragmentary, diagrammatic elevational view showing a portion of an assembly including the unit of FIGS. 1 and 2.

One portion of a unit substrate 32 is shown in FIG. 3. In the particular embodiment illustrated, terminals 38 and 40 are solderable lands. Each unit has vertical directions from the top to the bottom and has horizontal directions transverse to the vertical directions. Thus, the horizontal directions extend parallel to the planes of the top and bottom of the unit. For convenience, a horizontal direction to the left as seen in FIG. 1 is referred to herein as the "north" direction ("N"); whereas an orthogonal horizontal direction, to the bottom of the drawing in FIG. 1, is referred to herein as the "west" direction ("W"). The top terminals 38 and the bottom terminals 40 are disposed in positions referred to herein as column positions. Terminals at the same column position on a given unit are disposed at the same position in the horizontal directions of the unit.

Although the particular embodiment is described with reference to solderable units, it should be appreciated that units having other forms of terminals on their top and bottom sides can be employed. Merely by way of example, the terminals may be in the forms of pins and sockets, metallic bumps or other conductive contacts. Also, it is not necessary to employ a flat, board-like, or tape-like substrate such as the substrate depicted. For example, each unit substrate may be a ceramic or other chip carrier having a pocket or hole arranged to receive the chip or chips and having contacts on top and bottom sides of the substrate. Indeed, where a single semiconductor chip incorporates all of the functions required within a single unit, the chip itself can be provided with terminals on its top and bottom sides, so that each unit consists only of the chip. In a further variant, some or all of the terminals on the top and bottom sides of the substrate may be formed by common elements. For example, as disclosed in co-pending, commonly assigned U.S. patent application Ser. No. 10/267,450, filed Oct. 9, 2002, the disclosure of which is incorporated by reference herein, a terminal in the form of a pad disposed on one surface of the substrate may be exposed to the opposite surface of the substrate through a hole in the substrate, so that the same pad defines terminals exposed at both sides of the substrate. The SRAM chips incorporated within each unit cooperate with the FPGA of such unit. Each unit incorporates appropriate connections (not shown) between the SRAM and the FPGA.

Figure 4:
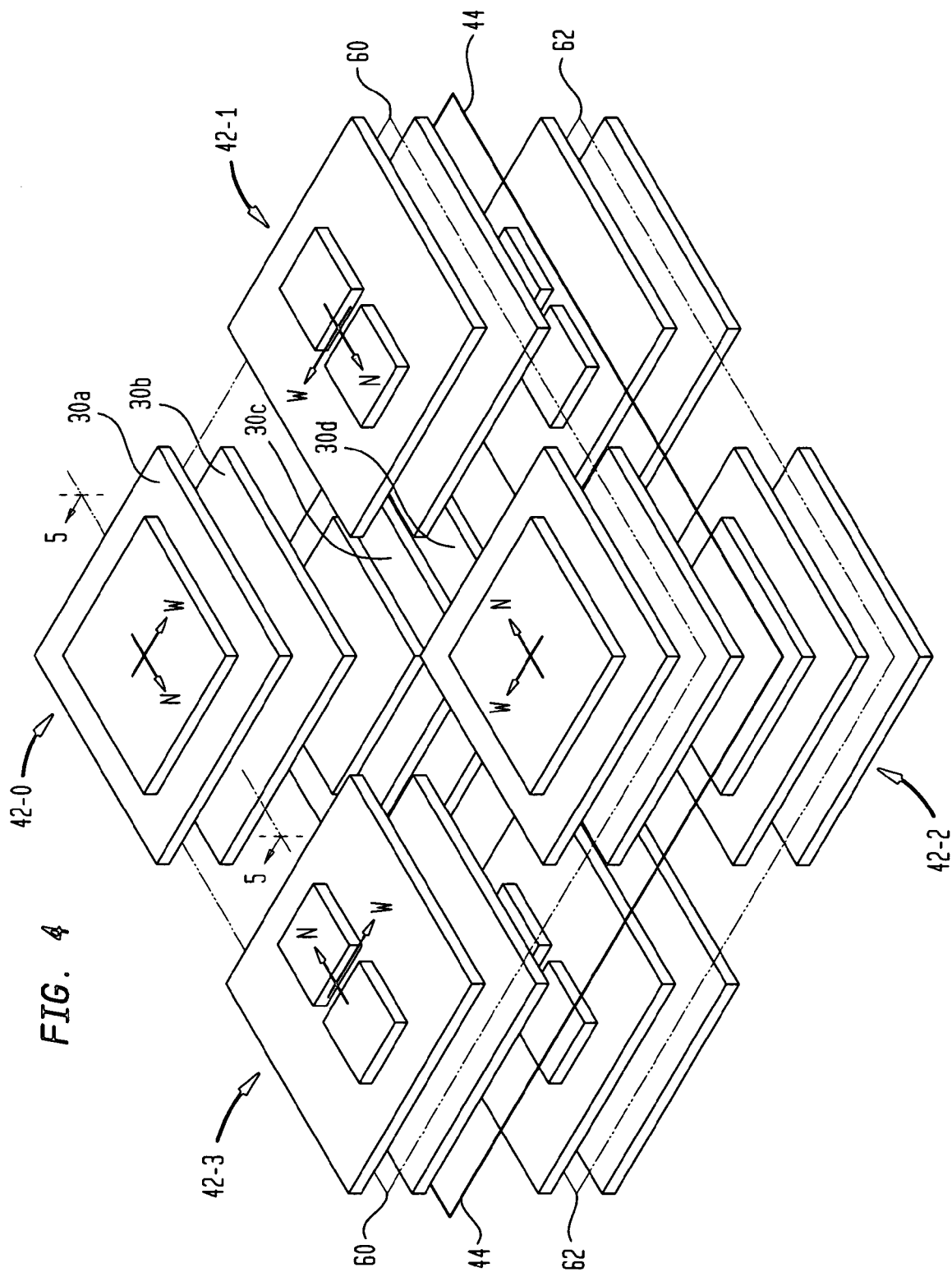
FIG. 4 is a diagrammatic perspective view of the assembly depicted in FIG. 3.
Figure 5:
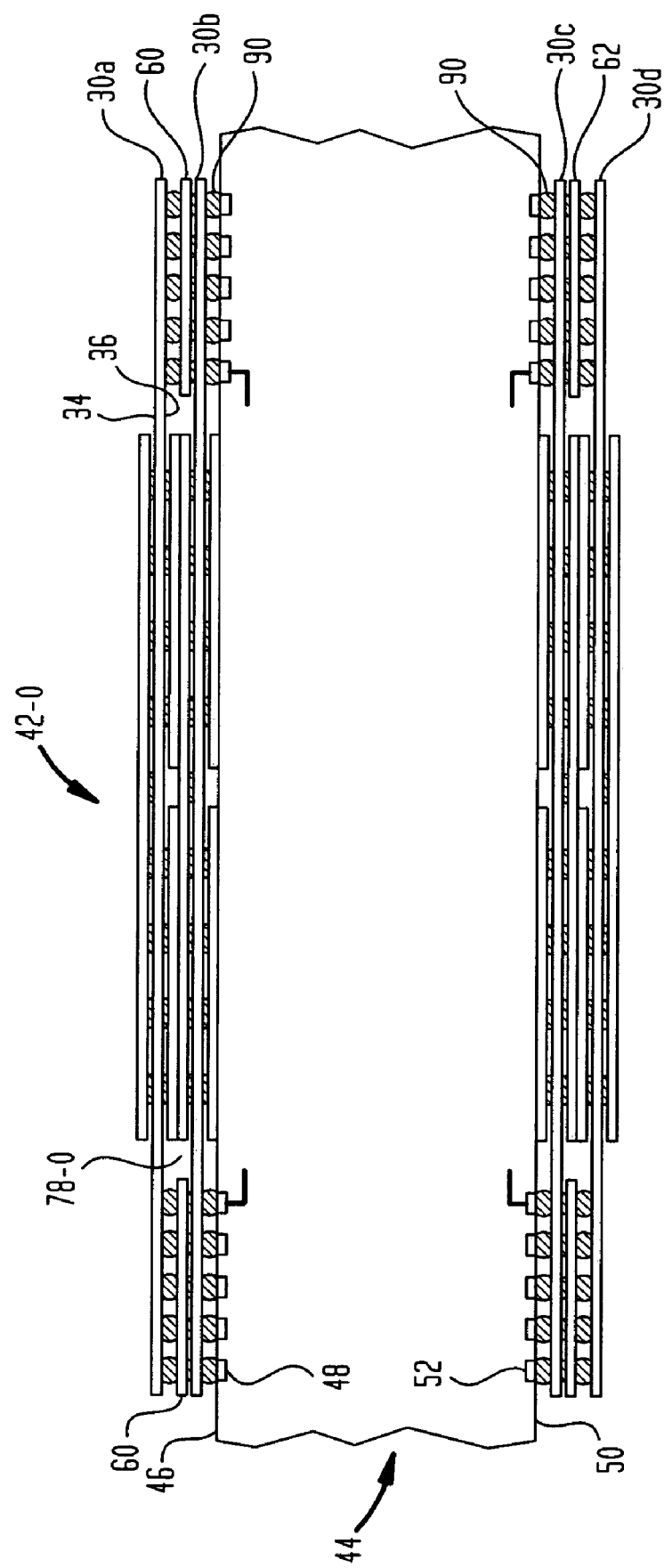
FIG. 5 is a fragmentary, diagrammatic, sectional view taken along line 5—5 in FIG. 4.

As best seen in FIG. 4, the units are arranged in four stacks (42-0, 42-1, 42-2 and 42-3). Each stack includes four units superposed, one above the other. For example, stack 42-0 includes units 30A, 30b, 30c and 30d). The four stacks of four units thus provide 16 units and 16 FPGAs in all. The system also includes a printed circuit board 44. For clarity of illustration, circuit board 44 is shown as a transparent plane outlined by a solid black line in FIG. 4. As best seen in FIG. 5, circuit panel 44 is a multilayer circuit board including several layers of dielectric material and internal conductors (not shown), as well as other conventional elements commonly found in a circuit board. Circuit board 44 has an upper surface 46 with upper pads 48 exposed at such upper surface, and has an oppositely directed lower surface 50 with lower pads 52 exposed at lower surface 50. As shown in FIGS. 4 and 5, two units of each stack lie above PCB 44, whereas two units lie below the PCB. For example, in stack 42-0, units 30a and 30b lie above the PCB, whereas units 30c and 30d lie below the PCB. All of the units within each stack have the same orientation. Units 30a and 30b, disposed above PCB 44, have their top sides 34 facing upwardly, away from the PCB, whereas units 30a and 30b, disposed below the plane of the PCB, also have their top sides 30c and 30d facing upwardly; but in this case, the top sides face toward the PCB. Also, within a single stack, all of the units have their horizontal directions oriented in the same way. The internal structures of all of the units in each stack, and indeed all of the units in all of the stacks, are identical to one another. The ability to use identical units, desirably without modification of individual units, greatly reduces the number of different components which must be handled and stocked, and thus reduces the cost of the assembly.

The units within each stack are aligned with one another in their horizontal directions, so that terminals on all of the units in the same column position are vertically superposed above one another. Stated another way, a vertical line drawn through a terminal at a particular column position on one unit will pass through all of the other terminals at the same column position on the other units in the stack.

At numerous column positions, the terminals of all of the units within the stack are connected so that all of the terminals disposed at the same column position are connected to one another and connected to the printed circuit board. In this arrangement, referred to as a "normal stack connection" and shown in FIG. 3, the top terminal at each position on a given unit is electrically connected to the bottom terminal at the same position on the same unit. Moreover, the bottom terminal at each position is electrically connected by one or more conductive elements to the top terminal of the next lower unit at the same position. For example, as shown in FIG. 3, top terminal 38a is connected to the bottom terminal 40a of the same unit 30a, and in turn, electrically connected to top terminal 38b of the next lower unit 30b.

As further discussed below, elements referred to herein as interposers 60 and 62 (shown as transparent planes with broken line borders in FIG. 4, and also shown in FIGS. 3 and 5) extend between portions of the units in each stack. As also discussed below, interposer 60 and 62 themselves are configured as circuit panels with terminals on their top and bottom surfaces. At those column positions where normal or straight-through connections are desired, interposers 60 and 62 have pairs of terminals aligned with one another and connected to one another, as exemplified by terminals 64 and 66 on interposer 60 in FIG. 3. These terminals simply form part of the conductive connection between the bottom terminal 40 on each unit and the top terminal 38b on the next lower unit in the stack at the same column position. The conductive connections desirably include conductive bonding materials such as solder masses. As seen in FIG. 3, a solder mass 68 connects lower terminal 40a to the corresponding terminals 64 on the top surface of interposer 60, whereas a further solder element such as a relatively thin solder layer 70 connects terminal 66 of the interposer to the top terminal 38b of second unit 30b in the stack.

At those column positions where a straight-through or normal connection runs throughout the entire stack, printed circuit board 44 has a pair of upper and lower pads 48 and 52 referred to herein as a "common pair." One such common pair includes pads 48a and 52a (FIG. 3). Pads 48a and 52a are substantially aligned with one another, so that upper pad 48a lies directly above lower pad 52a at the same column position. These pads are electrically connected to one another by a conductor 72 extending through the printed circuit board. As depicted in FIG. 3, conductor 72 is a simple via extending straight through all of the layers (not shown) of the printed circuit board. This is not essential; the conductor connecting the pads of a common pair may include horizontal or zigzag portions, as required to route the connection around other conductors in the printed circuit board. However, a straight or nearly straight-through vertical conductor is preferred. The common pair of pads on the circuit board and the conductor connecting these pads forms part of a conductive connection at the column position between the units above the PCB and the units below the PCB. Thus, as seen in FIG. 3, the bottom unit terminal 40b on the second unit 30b in the stack, immediately above the PCB, is connected to the upper pad 48a of the common pair by a further conductive element such as a solder ball 74; whereas the lower pad 52a of the common pair is connected by another conductive element such as a solder ball 76 to the top unit terminal 38c on the third unit 30c, disposed immediately below the printed circuit board. This configuration is repeated at all column positions where a normal or a straight-through connection extending through the entire stack is desired. The ability to make connections between portions of the stack above and below the printed circuit board using a relatively simple, desirably straight connection through the board greatly simplifies the board layout.

Figure 6:
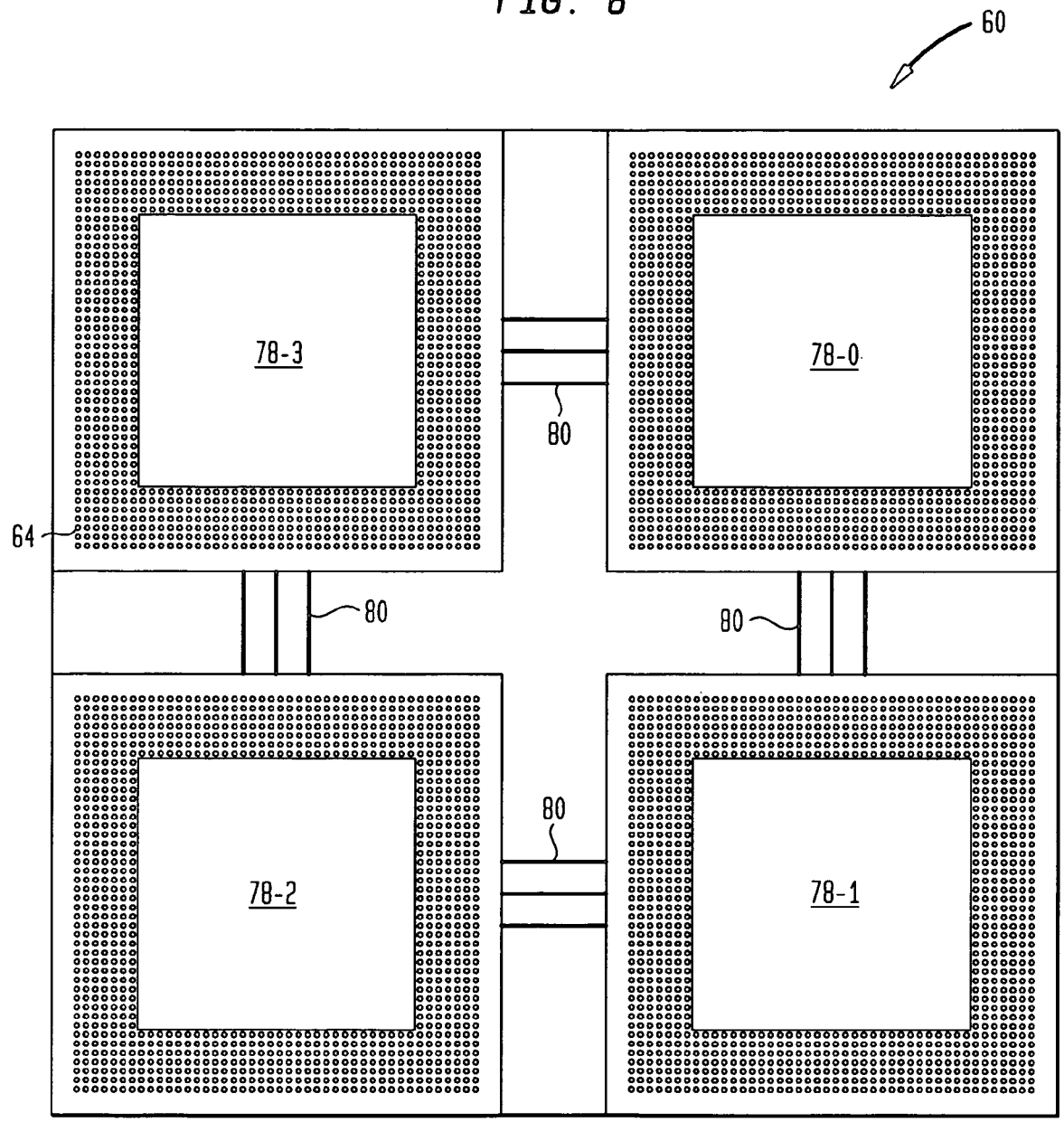
FIG. 6 is a diagrammatic top elevational view of a component used in the assembly of FIGS. 3–5.

As best seen in FIG. 6, the upper interconnect interposer 60 is a large circuit panel, such as a rigid or flexible circuit board. The interconnect interposer includes four holes 78-0 through 78-3 extending through the panel from its top surface to its bottom surface. The interconnect interposer further includes an array of top interposer terminals 64 surrounding each hole on the top side of the interconnect interposer. Each such array of terminals includes terminals at the same column positions as the terminals of the individual units in one stack. Interposer 60 also has a corresponding array of bottom interposer terminals (66; FIG. 3) on its bottom surface. Upper interposer 60 desirably has conductive connections such as traces 80 extending between the various terminal arrays, and particularly, between the mutually adjacent edges of the various terminal arrays. These are shown only schematically in FIG. 6. These traces are connected to selected ones of the top and bottom terminals to interconnect the stacks with one another, as further discussed below. The upper interposer 60 intersects all four of the stacks, as does the lower interposer. Only a portion of the interconnect interposer or mezzanine interposer is seen in FIG. 5. One array of top interposer terminals 64 and the corresponding array of bottom interposer terminals 66 (FIG. 3) surrounding hole 78-0 is disposed in alignment with the unit terminals of the units in stack 42-0, whereas hole 78-0 is aligned with the chips of the units in stack 42-0 so that the chips are received in the hole.

At those column positions where a normal stack connection, as discussed above with reference to FIG. 3 is desired, the top and bottom interposer terminals 64 and 66 at the same column position are electrically connected to one another so that the interconnect interposer acts as a straight pass-through and does not affect the normal connection arrangement. The upper interposer acts as a spacer between the two units of the stack disposed above. This arrangement permits the use of relatively small solder balls. Stated another way, with the mezzanine interposer, the height of each individual solder ball may be less than the aggregate height of the SRAM 43 (FIG. 2) on the bottom of one unit and the FPGA 41 (FIG. 1) on the top of the next lower unit. The use of small solder balls is advantageous, in that it allows the use of relatively small diameter terminals, which conserves space on the surfaces of the units.

The upper interposer 60 is connected in each of the other stacks 42-1 through 42-3 in the same manner. The lower interposer (62; FIGS. 4 and 5) is configured similarly to the upper interposer, and also intercepts all four of the stacks in the same way as the upper interposer. The lower interposer 62 performs exactly the same spacing function with respect to the units disposed below the PCB.

The various first microelectronic elements or FPGAs 41 located within the stacks are interconnected with one another. At each such interconnection, an output of one FPGA is connected to an input of another FPGA. As mentioned above, the internal structure of every unit is identical to the individual structure of every other unit. For example, each unit has a top terminal at a given column position connected to an output or contact of the FPGA chip itself. Likewise, each unit has a top terminal at another position, connected to an input pad on the FPGA of the unit. Thus, connecting all of the terminals at the same column position within a particular stack to one another would not connect inputs to outputs, but instead would short inputs together and short outputs together.

Figure 7:
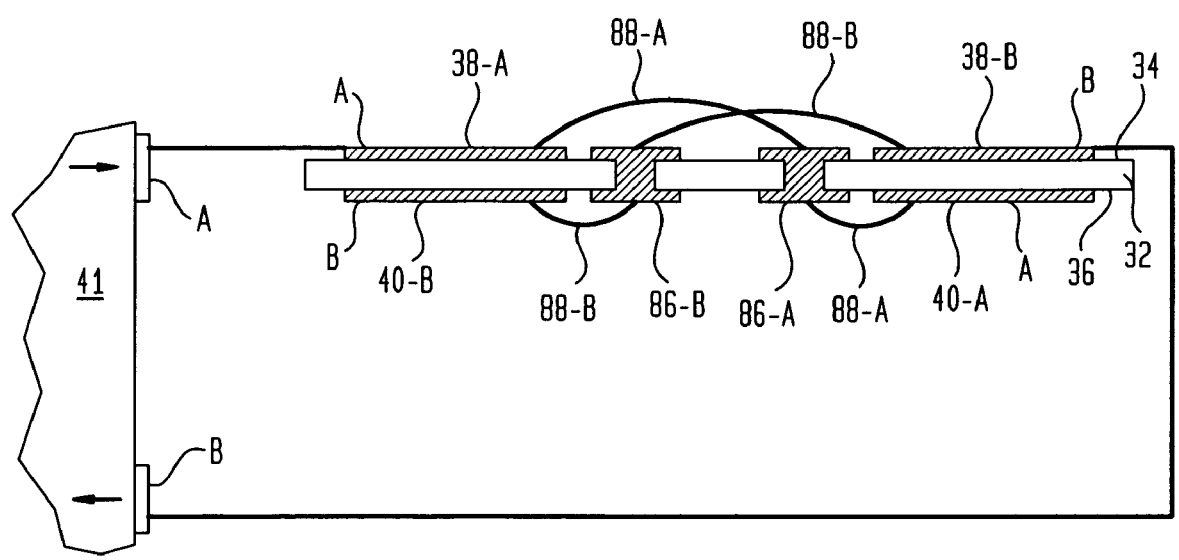
FIG. 7 is a fragmentary, partially schematic sectional view showing a portion of the unit depicted in FIG. 1.
Figure 8:
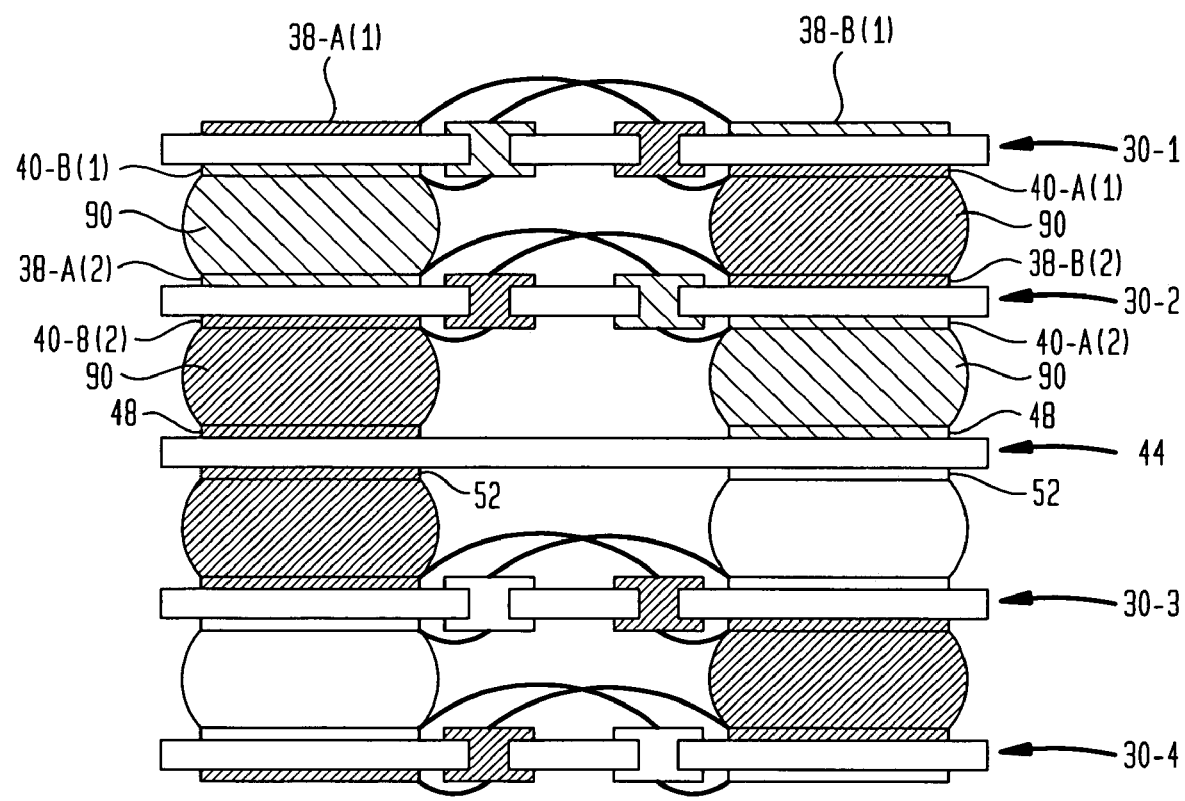
FIG. 8 is a fragmentary, diagrammatic elevational view showing a portion of the assembly depicted in FIGS. 3–5, with certain components omitted for clarity of illustration.

To provide connections between inputs and outputs of the first microelectronic elements or FPGAs of adjacent units within a stack, the terminals associated with the input and output pads are arranged and connected as shown at FIGS. 7 and 8. Each unit has a set of terminals, referred to herein as "A" terminals. This set of terminals includes a top terminal 38-A disposed at a first column position. Like all of the other top terminals 38, this terminal (also referred to as a "top A terminal") is exposed at the top surface 34 of unit substrate 32. The set of A terminals also includes one of the bottom unit terminals 40, referred to herein as a bottom A terminal 40-A, exposed at the bottom surface 36 at a second column position. The top and bottom A terminals are electrically connected to one another, as by a via 86-A and traces 88-A. Similarly, each unit also includes a set of "B" terminals. This set includes a top B terminal 38-B exposed at the second column position, and hence lying directly above the bottom terminal 40-A. The set of B terminals also includes a bottom B terminal 40-B exposed on the bottom surface of the unit substrate at the first column position, directly below the top A terminal 38-A. These B terminals are interconnected to one another as by via 86-B and associated traces 88-B. For clarity of illustration, the traces shown are shown in FIG. 7 as arcuate lines. Although these lines are shown as projecting from the surfaces of the unit substrate 32, in normal practice, they are traces extending along the surface of the substrate or within the substrate. The first microelectronic element or FPGA 41 in each unit has an output or A pad electrically connected to the A terminals and an input or B pad electrically connected to the B terminals. In the particular embodiment illustrated, where the FPGA is disposed on the top surface of the unit substrate, the A and B terminals typically are connected to the A and B pads respectively by traces extending along the top surface of the substrate, but any other form of connection may be used.

Here again, top and bottom terminals on adjacent units in the stack disposed at the same column position are connected to one another by conductive elements 90. Conductive elements 90 are depicted as simple solder ball interconnects in FIG. 8. In actual practice, these conductive interconnects may include top and bottom terminals of interposers 60 and 62 as discussed above. Here again, the interposer terminals simply form part of the conductive connection between a bottom unit terminal on one unit and the top unit terminal at the same column position on the unit immediately below. The interposers are omitted in FIG. 8 for clarity of illustration.

The bottom A terminal 40-A(1) of the top-most unit 30-1 is connected to the top B terminal 38-B(2) of the next lower unit 30-2. Conversely, the bottom B terminal of the top-most unit 30-1 is connected to the top A terminal 38-A(2) of the next lower unit 30-2. Thus, the A terminals of each unit are connected to the B terminals of the adjacent unit, so that the output or A pad of the FPGA 41 (FIG. 7) in each of these two units is connected to the input or B pad of the FPGA 41 (FIG. 7) in the other one of these units. As also shown in FIG. 8, the connections are carried down to upper pads 48 on the PCB. However, these connections are not necessary for interchange of information between the units. The conductive connections between the lower unit 30-2 and pads 48 could be omitted, but preferably are used so as to avoid the need for special solder ball arrangements at different locations within the stack. Also, if desired, the PCB 44 can be provided with traces so that these signals can be accessed from outside the stack. At these column positions, the PCB does not connect through to the other units (30-3 and 30-4) of the stack, below the PCB. These other units, however, are connected to one another in exactly the same way as units 30-1 and 30-2 are connected to one another.

The connection discussed with reference to FIGS. 7 and 8 provides conductive paths which cross between column positions. Thus, one such conductive path extends at a first column position at terminal 38-A(1) at the top of the stack and then at a second column position (at terminals 40-A(1) and 38-B(2) in the middle of the stack, and then crosses again back to the back to the first column position at terminal 40-B(2) and the associated upper pad 48 of the substrate. The other crossed conductive path starts at the second column position at terminal 38-B(1), crosses to the first column position in the middle of the stack at terminals 40-B(1) and 38-A(2), and then crosses back again to the second column position at terminals 40-A(2) and the associated pad 48 on the printed circuit board. These conductive paths are shaded differently in FIG. 8 for clarity of illustration. Similar crossing conductive paths exist in the lower portion of the stack, below the printed circuit board. In this embodiment, the crossing pair of conductive paths is applied to allow connections from inputs to outputs on different units, even though both units have the identical structure. Other applications for crossing conductive paths are discussed below. In this regard, it should be noted that the crossing conductive paths depicted in FIGS. 7 and 8 extend along a pair of column positions which are adjacent to one another. However, any two column positions within the stack can be crossed with one another. The connection traces which are used to provide the crossing (such as traces 88 and 86 in FIG. 7) would be longer when the column positions used for a pair of crossing conductive paths are not adjacent to one another. Also, a stack may include any number of crossings. Thus, an individual pair of conductive paths may cross one another once or more than once along the vertical extent of the stack.

Figure 9:
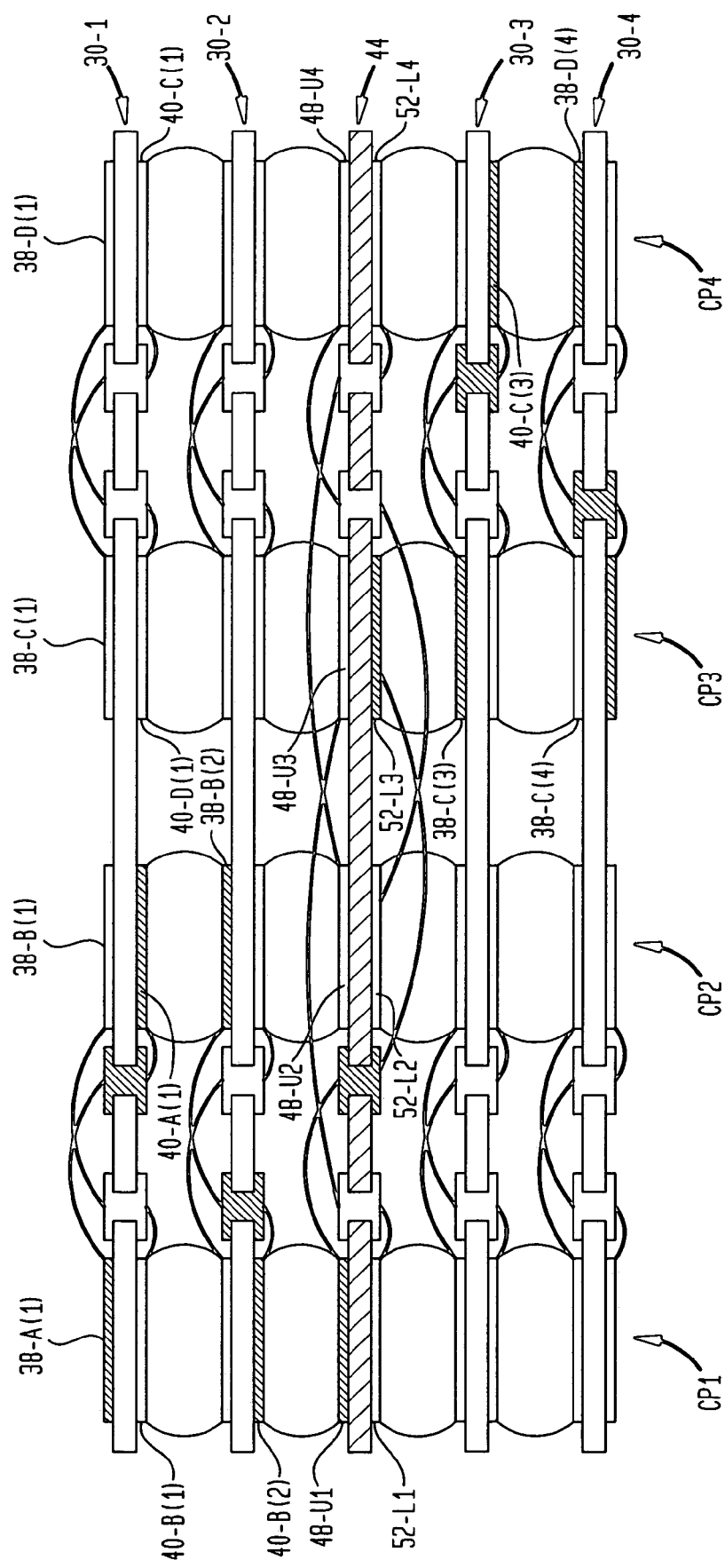
FIG. 9 is a view similar to FIG. 8, but depicting a further portion of the assembly.

In other instances, it is necessary to make connections between the output connections of the FPGA in one unit in a stack and the input or B connections of the FPGA in another, non-adjacent unit in the same stack. The arrangements used for such connections are shown in FIG. 9. Here again, interposers 60 and 62 are omitted for clarity of illustration. Here again, each unit includes a set of A terminals and a set of B terminals at first and second column positions CP1 and CP2 in exactly the same arrangement as discussed above with reference to FIGS. 7 and 8. Here again, the A terminals (e.g., 38-A(1) and 40-A(1)) on each unit are electrically connected to one another but are not electrically connected to the B terminals (38-B(1) and 40-B(1)). Each unit also includes a set of C terminals and a set of D terminals at third and fourth column positions. The C terminals and D terminals are configured in a manner similar to the A and B terminals. For example, the C terminals on unit 30-1 include a top C terminal 38-C(1) at third column position CP3 and a bottom C terminal 40-C(1) at fourth column position CP4, the C terminals being electrically connected to one another. The D terminals on this unit include a top D terminal 38-D(1) at fourth column position CP4 and a bottom D terminal 40-D(1) at the third column position CP3. The D terminals are electrically connected to one another by other traces and vias.

In each unit, the A terminals are connected to an output pad of the first microelectronic element or FPGA. However, the B terminals are not connected to a pad of the FPGA. The C terminals are connected to an input pad of the FPGA carried by the unit, whereas the D terminals are not connected to a pad of the FPGA. Here again, the bottom terminals of each unit are connected to the top terminals of the next adjacent unit, except that the bottom terminals of second unit 30-2 are connected to the upper pads 48 of PCB 44 disposed at the same column positions, whereas the top terminals of unit 30-3, disposed immediately below the PCB 44, are connected to the lower pads 52 of the PCB at the same column positions. In this instance, the upper pad 48 at each column position of the first through fourth column position shown in FIG. 9 is connected to the lower pad 52 of the circuit board at another column position at these first through fourth positions. The upper pad 48-U1 at the first column position CP1 is connected to the lower pad 52-L3 at the third column position. The output connection is carried from the A terminals 38-A(1) and 40-A(1) of top unit 30-1 down through terminals 38-B(2) and 40-B(2) to upper pad 48-U1 at first column position CP1, (shaded in FIG. 9) and routed along the PCB down to the lower pad 52-L3 at the third column position. The solder ball below this PCB pad connects to the top C terminal 38-C(3) on unit 30-3 immediately below the PCB, and hence connects to the input pad of the FPGA in that unit. Here again, because the units are identical, the connection continues down through the bottom C terminal 40-C(3) at the fourth column position, but the solder ball below that bottom C terminal connects to a D terminal 38-D(4) on the top of bottom unit 30-4, and hence, does not connect to the FPGA of this unit. Also, the conductive path connects to a B terminal 38-B(2) on the second unit 30-2 but does not make a connection to the FPGA of that unit, because the B terminals are not connected. Thus, the output of the FPGA in top unit 30-1 is connected only to the input of the FPGA in third unit 30-3 in the same stack.

The PCB also has an upper pad 48-U2 at the second column position CP2 connected to a lower pad 52-L4 at the fourth column position CP4. The output of unit 30-2 is connected through these upper and lower pads on the PCB and through the other units to terminal 30-C(4) of unit 30-4. Likewise, the PCB has a lower pad 52-L(1) at the first column position CP1 connected to an upper pad 48-U3 at the third column position CP3, and also has a lower pad 52-L2 at the second column position CP2 connected to an upper pad 48-U4 at the fourth column position CP4. The lower pad 52-L1 at the first column position, in conjunction with the conductive paths defined by the units, connect the A terminals, and hence the FPGA output contact of unit 30-3 to the C terminals, and hence the FPGA input, of unit 30-1. The lower pad 52-L2 at the second column position and upper pad 48-U4 at the fourth column position serve to connect the A terminals, and hence the FPGA output contact of unit 30-4 to the C terminals, and FPGA input contact of unit 30-2.

Figure 10:
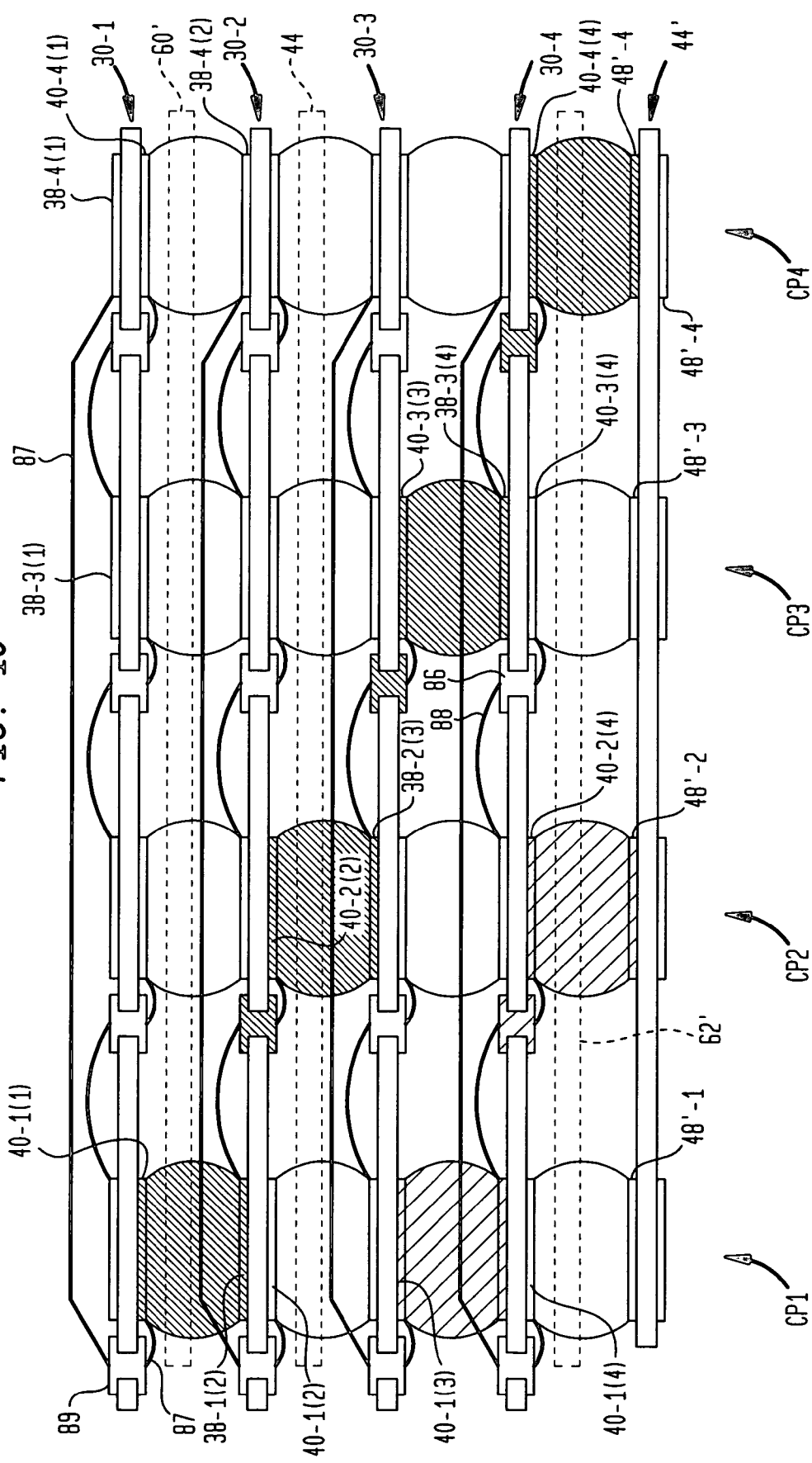
FIG. 10 is a view similar to FIGS. 8 and 9, but depicting yet a further portion of the assembly.

At still other locations within each stack, there are unique connections between the units of the stack and the printed circuit board. That is, a signal is routed from the PCB to only one unit in the stack. Where these unique connections are desired, top terminals 38 and bottom terminals 40 are provided on each unit at a set of four column positions CP1 through CP4 as shown in FIG. 10. Here again, these column positions are depicted as physically adjacent to one another for clarity of illustration, but need not be physically adjacent to one another. At each of these column positions, each unit has a bottom terminal and a top terminal. Within each unit, each top terminal 38 is connected to the bottom terminal 40 in the next-higher column position of the set. For example, the bottom terminal 40-4(4) on unit 4 at the fourth column position CP4 is electrically connected to the top terminal 38-3(4) of the same unit in the third column position. These connections can be made, for example, by traces 88 and vias 86. Moreover, within each unit the top terminal 38 at the highest-ordered column position CP 4 of the set is electrically connected to the bottom terminal 40 at the lowest-ordered column position of the set, as by further traces 87 and via 89. Here again, the traces are schematically indicated by lines shown extending above and below the planes of the unit substrates, but in practice these connections typically extend along the surfaces of the substrate or within the substrate. As seen in FIG. 10, the electrical connections run in a stair-step fashion, traversing over one column position at each unit. Thus, the electrical connections traverse the shaded elements, including terminals 40-4(4) and 38-3(4) on unit 30-4; 40-3(3) and 38-2(3) on unit 30-3; 40-2(2) and 38-1(2) on unit 30-2; and 40-1(1) on unit 30-1. Thus, each conductive path extends in a stair-step fashion, moving one column position towards the highest-ordered column position of the set (towards CP4) as it moves down one unit in the stack and, conversely, moving one column position toward the lowest-ordered column position (towards CP1) as it moves up one unit in the stack. Each unit has a connection between a particular contact (not shown) on a microelectronic element and the bottom terminal 40 at a particular column, position, in this case the first column position. For example, the first microelectronic element or FPGA 41 of unit 30-1 has a contact connected to terminal 40-1(1); the same contact on the first microelectronic element or FPGA of unit 30-2 is connected to bottom terminal 40-1(2) of unit 30-2. Likewise, unit 30-3 has the same contact on the microelectronic element connected to bottom terminal 40-1(3), whereas unit 30-4 at the bottom of the stack has the same contact pad of the microelectronic element connected to terminals 40-1(4). The other top and bottom terminals at column positions CP1-CP4 are not connected to the microelectronic elements of the various units. The stair-step arrangement prevailing throughout these column positions brings the connections to the four different microelectronic elements to four different terminals 40-1(4); 40-2(4); 40-3(4); and 40-4(4) on the bottom of the bottom unit 30-4. A circuit board 44' positioned at the bottom of the stack may have four unique pads 48'-1 through 48'-4 connected to these unique terminals. For example, a signal supplied from the PCB at pad 48'-4 in the fourth column position CP4 will pass to bottom terminal 40-1(1) in the first column position of UNIT 30-1. Similarly, the signal supplied through at the second column position through pad 48'-2 (also shaded), will pass to the identical terminal 40-1(3) on the bottom surface of unit 30-3.

Moreover, each conductive path runs to the highest-ordered column position at top of the unit where the connection reaches the lowest-ordered column position. For example, the conductive path from terminal 40-3(4), at the third column position on the bottom of unit 30-4 runs up to bottom terminal 40-1(2) at CP1 on unit 30-2, and then to top terminal 38-4(2) at CP4 on the same unit 30-2. The conductive path thus connects to bottom terminal 40-4(1) on the bottom of unit 30-1 and thus to top terminal 38-3(1) at CP3, on the top of the top unit 30-1. Thus, each of the conductive paths extends through all four of the units, and ultimately returns to the same column position as it had at the bottom of the stack. Stated another way, the "stair-step" arrangement is topologically similar to a spiral staircase; in connection involving a set of N column positions, the arrangement repeats after N units. As further discussed below in connection with FIG. 13, units having such a spiral connection can be stacked more than N units high, so that some or all of the conductive paths connect to more than one unit. Also, FIG. 10 depicts four units disposed on the same side of the PCB. In the embodiment illustrated in the other figures, two units within each stack are disposed on the top and two units are disposed on the bottom, as indicated by the PCB 44 shown in broken lines in FIG. 10. Because each conductive path passes through all of the units (at different column positions), the conductive paths will still connect to unique pads on a circuit board 44 at the location depicted in broken lines. Alternatively or additionally, pads on a top interposer shown in broken lines at 60' or a bottom interposer 62' can also be connected to unique conductive paths. The interposer or circuit board used in such an arrangement desirably has top and bottom pads directly connected to one another as discussed above in connection with FIG. 3. Alternatively, only two column positions need be occupied by the stair-step set of column positions to provide unique connections to each of the units, provided that the PCB has separate pads on its top and bottom surfaces. Where the stack extends on each side of the PCB N units or less (N being the number of column positions in the set), the connection between the top pad at the highest-ordered column position and the bottom pad at the lowest-ordered column position (as defined by traces 87 and via 89 in FIG. 10) can be omitted.

The discussion above refers to connections with the first microelectronic element or FPGA in each of the various units. Any or all of these techniques can be used to provide connections with the second microelectronic elements in each of the various units.

The foregoing discussion relates to connections within each individual stack. However, it is also necessary to connect units in different stacks to one another. In particular, inputs and outputs of FPGAs in units of different stacks must be connected to one another. Several features of the system facilitate these inter-stack interconnections. First, as seen in FIG. 4, the stacks are disposed in a grid, so that each stack has a side facing a side of another stack. For example, a side of stack 42-0 faces a side of stack 42-1, whereas another side of stack 42-0 faces a side of stack 42-3. However, two of the stacks are inverted relative to two of the other stacks. As seen in FIG. 1, the bottom of stack 42-1 points upwardly relative to the PCB (upwardly in the drawing), whereas the top of stack 42-0 points upwardly relative to the PCB 44. Stack 42-2 has its top facing upwardly, whereas stack 42-3 has its bottom facing upwardly. Further, stack 42-2 is rotated 180° relative to stack 42-0 about a vertical axis, whereas stack 42-3 is rotated 180° relative to stack 42-1. The net effect is that corresponding sides of the stacks face one another. That is, the westerly side of stack 42-0 faces the westerly side of stack 42-1, whereas the northerly side of stack 42-1 faces the northerly side of stack 42-2, and so on. The terminals which require inter-stack connections are placed along the westerly and northerly sides of the stacks. The upper interposer 60 is provided with connection lines 80 (FIG. 6) interconnecting terminals associated with the various stacks. Very short interconnect lines can connect terminals associated with the northerly edge of stack 42-3 and the northerly edge of stack 42-0, and similar short connection lines will connect the westerly edge of stack 42-0 with the westerly edge of stack 42-1, and so on.

Figure 11:
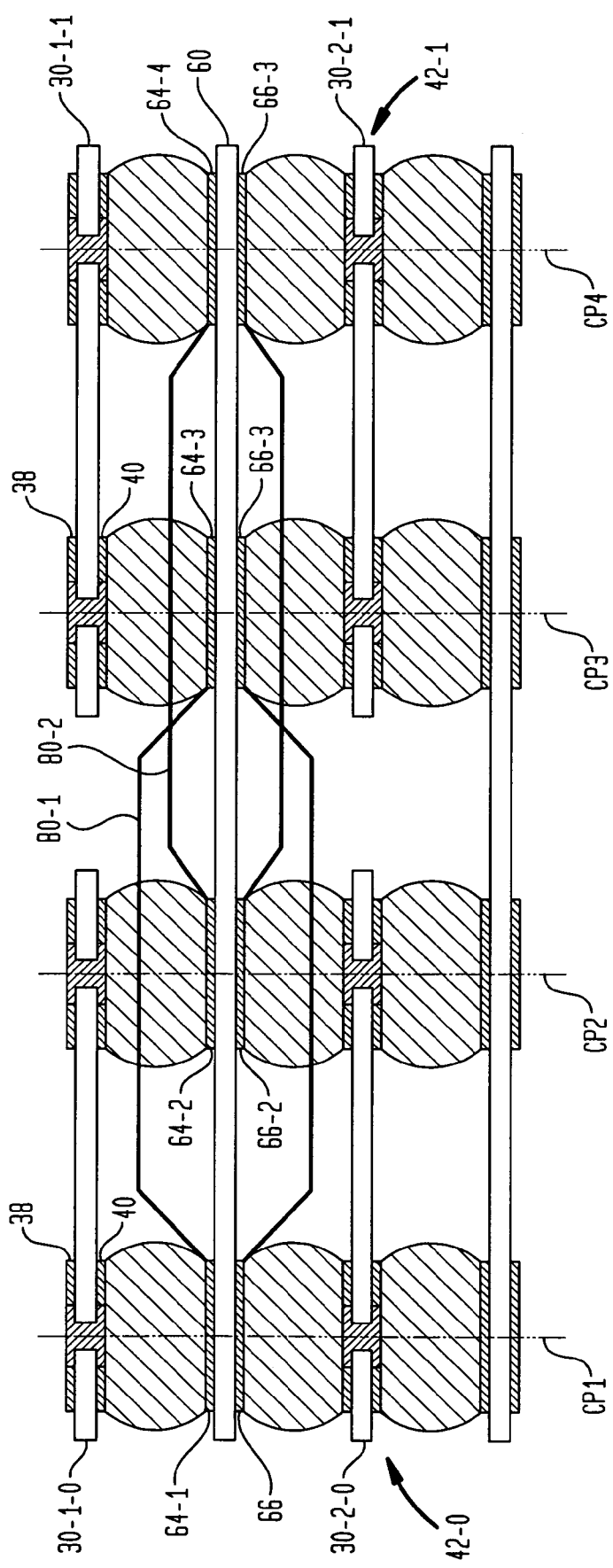
FIG. 11 is a further fragmentary, diagrammatic elevational view depicting yet another portion of the same assembly.

As seen in FIG. 11, the top interposer has a set of top terminals 64-1 and 64-2 associated with column positions CP1 and CP2 of stack 42-0, for example, on the westerly edge of stack 42-0, electrically connected by traces 80-1 and 80-2 to corresponding top terminals 64-3 and 64-4, at column positions CP3 and CP4 on the westerly edge of stack 1. At these column positions, each unit has top and bottom terminals 38 and 40 at the same column position directly connected to one another, as discussed above with reference to FIG. 3. At column position CP1, each unit 30 has its terminals 38 and 40 connected to an input pad of the FPGA or first microelectronic element. At column position CP3, each unit has its terminals 38 and 40 connected to an output pad of the FPGA within that unit. Similarly, the terminals at column positions CP2 are connected to an output pad of the FPGA, whereas the terminals on the various units at column positions CP 4 are connected to an input pad of the FPGA. Thus, the output from the FPGA in unit 30-1-0 in stack 42-0 is connected to the input of the FPGA in unit 30-1-1 in stack 42-1, and other connections are made in similar fashion. The top interposer 60 has a similar set of bottom terminals 66 and associated traces, which interconnect other units in the two stacks with one another in the same manner. The bottom terminals 66 and associated traces used for this function are electrically isolated from the top terminals 64 and associated traces 80-1 and 80-2. Stated another way, at these column positions, the mezzanine interposer does not provide an interconnection between the units in a single stack. The bottom interposer 62 is arranged in a similar fashion.

By routing inter-stack interconnections through the interposers, which are separate from the PCB 44, the PCB can be greatly simplified. Further, packaging each FPGA with its associated SRAMs also avoids the needs for traces on the PCB for interconnecting FPGAs with SRAMs. The PCB, thus, can have many fewer layers than would be required otherwise.

As one example, a conventional PCB with four FPGAs mounted directly on the PCB, and with SRAMs connected to the FPGAs through the printed circuit board itself, requires a printed circuit board with more than 25 layers. Such a circuit board is extraordinarily complex, and hence suffers significantly in cost and reliability. By contrast, the design as discussed above can accommodate 16 FPGAs and 32 SRAMs in the same circuit board area or less, using a PCB having fewer layers.

The features discussed above can be varied. For example, where an interposer is present between units in a stack, the mezzanine interposer may be provided with A and B pads at first and second column positions, as discussed above with reference to FIGS. 7 and 8 so as to interchange signals between column positions in the interconnect interposer. In this case, there is no need to interchange signals between column positions in the units themselves. Therefore, the top and bottom terminals of each unit at each column position may be directly connected to one another in the manner shown at FIG. 3, or else may be formed as parts of the same metallic pad. This can be used, for example, where the unit substrate has only a single layer of metal.

Also, the individual features discussed above can be utilized separately. For example, an arrangement utilizing a stack with portions disposed above and below a printed circuit board or other circuit panel, also referred to as a "mirrored" stack, is advantageous in and of itself, even where only one stack is used. Inter alia, by reducing the stack height on each side of the printed circuit board, cooling of the individual dies is greatly facilitated. Moreover, this result is achieved without the use of special "mirror image" sets of chips. As seen in FIG. 5, the conductive elements 90 are mounted on the top surfaces of the various units disposed below the circuit board, whereas the conductive elements are mounted on the bottom surfaces of the units disposed below the circuit board. The same arrangement can be used with any stackable units having terminals on its top and bottom surfaces, with or without the other features discussed above.

Also, chips other than FPGAs may be utilized. The number of chips per unit, the number of units per stack, and the number of stacks all can be increased or decreased.

Figure 12:
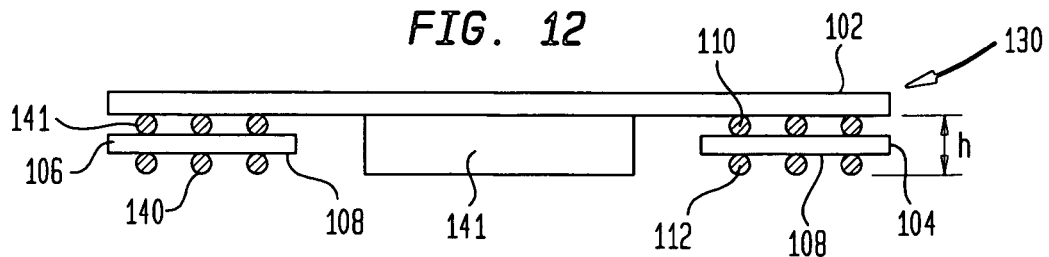
FIG. 12 is a diagrammatic sectional view depicting a unit in accordance with a further embodiment of the invention.
Figure 13:
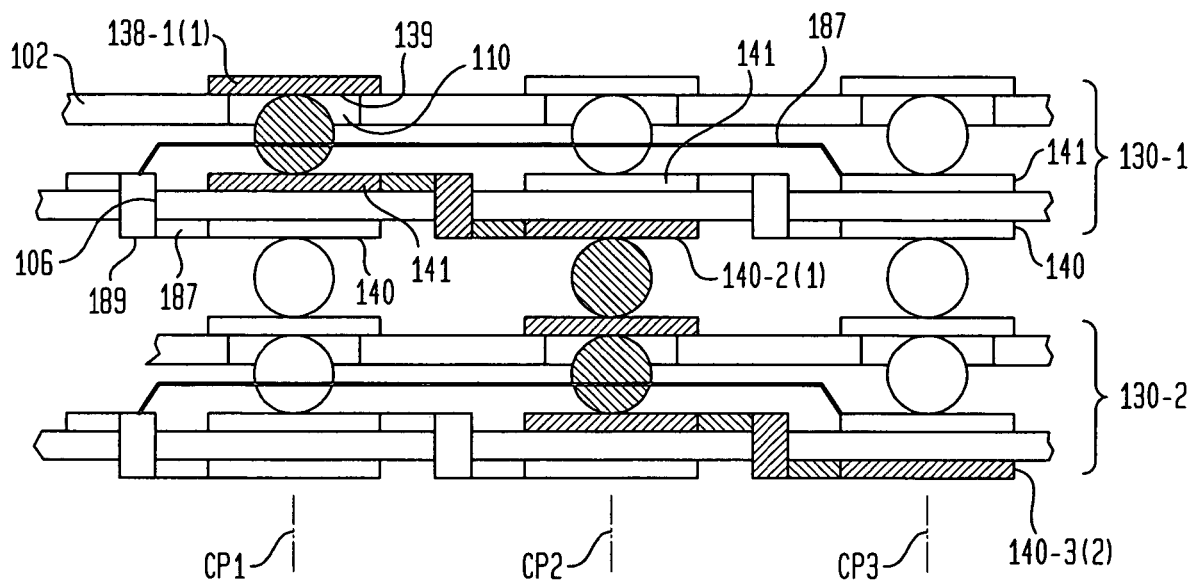
FIG. 13 is a fragmentary, diagrammatic sectional view depicting a portion of an assembly including units as shown in FIG. 12.

In the stacked packages discussed above, each unit has been described as having top and bottom terminals on the top and bottom surfaces of a single unit substrate. However, this is not essential. A unit 130 according to a further embodiment of the invention (FIG. 12) includes a structure consisting of a main unit substrate 102 and one or more interposers 104 and 106. Each interposer overlies only a portion of the bottom surface of main substrate 102, leaving a further portion of the bottom surface unoccupied. Microelectronic elements such as element 141 may be mounted on the unoccupied port of the bottom surface, on the aligned portion of the top surface or both. Interposers 104 and 106 may be separate elements, or may be a ring-like structure having a central opening which is aligned with the unoccupied portion of the main substrate 102. Interposer 106 includes a dielectric substrate such as a single-layer or multi-layer circuit panel substrate. Interposer 106 has terminals 140 exposed at its bottom surface and terminals 141 exposed at its top surface. Here again the main substrate 102 has terminals 138 exposed at its top surface and terminals 139 exposed at its bottom surface. As discussed below, signal rerouting between column positions is handled by the interposer rather than by the electrical connections on the main substrate. Thus, it is not essential to make the main substrate as a "two metal" structure for purposes of accomplishing rerouting between column positions. As depicted in FIG. 13, main substrate 102 may be a "single metal" structure so that a single metallic element defines both the terminals 138 exposed at the top surface and the terminals 139 exposed at the bottom surface of the main substrate through a hole 110 in the dielectric of the main substrate. Terminals 139 and 141 exposed at the confronting faces of the main substrate 102 and interposer and 106 are referred to herein as "internal" terminals inasmuch as they make connections within the unit, rather than connections to another unit in the stack, whereas terminals 138 and 140 are referred to herein as "external" terminals and constitute the top terminals 138 of the unit and the bottom terminals 140 of the unit.

The ability to use a single metal structure in the main substrate is a significant advantage. Although the interposer typically is a two metal structure, the interposer occupies a smaller area than the main substrate. As the cost penalty associated with fabrication of a two metal structure is incurred only over a smaller area, the costs of fabricating the entire assembly are reduced. Also, as best seen in FIG. 12, the solder balls 110 or other conductive elements used to connect the interposer with the main substrate 102 are stacked on top of the solder balls 112 used to connect the interposer with the next unit in the stack or with a printed circuit board. Moreover, the interposer 104 itself adds height. Therefore, an adequate height h below the main interposer 102 to accommodate microelectronic element 141 can be provided using relatively small solder balls. This, in turn, decreases the required horizontal spacing between solder balls at adjacent column positions and hence decreases the required size of the main substrate.

In the embodiment illustrated in FIG. 13, at the particular column positions illustrated, the internal terminal 141 is electrically connected to the external terminal 140 at the next column position in a set of column positions. This provides a connection between the top external terminal 138 of the unit and the bottom external terminal 140 of the unit at the next column position. For example, top external terminal 138 1(1) on unit 130-1 at column position CP 1 is electrically connected to bottom external terminal 140 2(1) on the bottom surface of interposer 106, which forms the bottom surface of unit 130-1. That external terminal is connected through a similar arrangement in the next unit 130-2 so that at the bottom of unit 130-2 the connection runs to bottom external terminal 140 3(2) at column position CP 3. Units with this arrangement provide a "stair step" routing within the stack, identical to the routing discussed above with reference to FIG. 10. As discussed above in connection with FIG. 10, such a unit optionally may have a connection between the top external terminal 138 at the highest-ordered column position of a set of column positions and the bottom external terminal 104 of the lowest-ordered column position. Because the top external terminal 138 of each unit is electrically connected to the internal terminal 141 on the interposer, such a connection optionally can be made by conductive elements of the interposer, such traces 187 and vias 189 which electrically connect the internal terminal 141 at the highest-ordered column position of the set (CP3 in FIG. 13) and the bottom external terminal 140 of at the lowest-ordered column position of the set.

Figure 14:
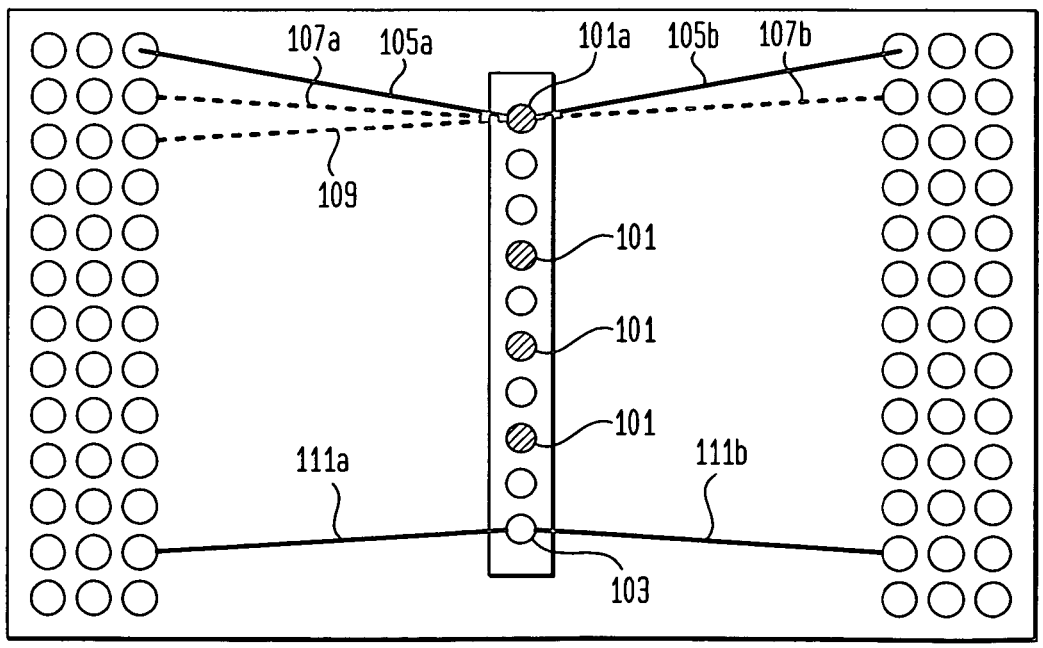
FIG. 14 is a diagrammatic top plan view of a portion of a memory assembly.
Figure 15:
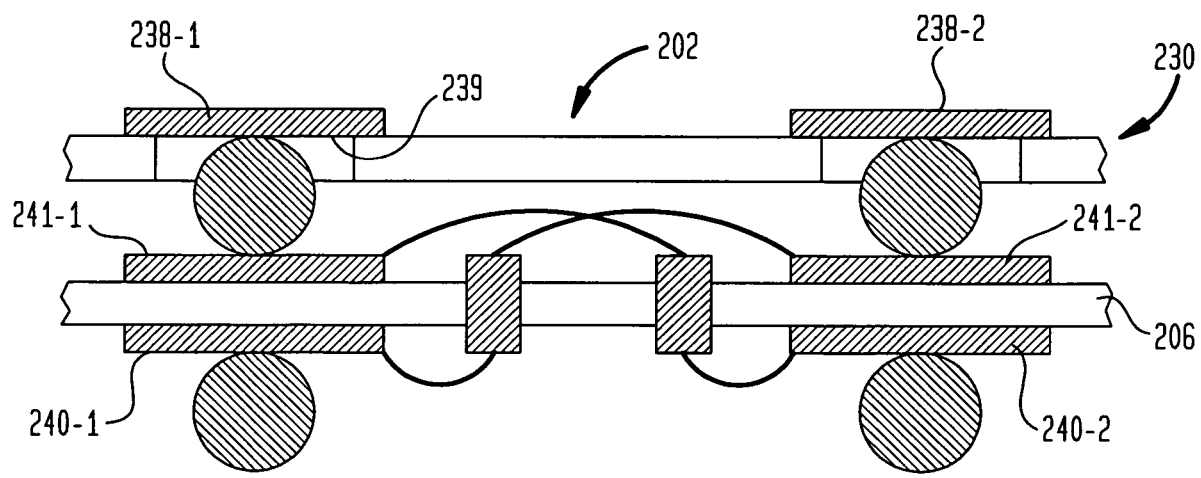
FIG. 15 is a fragmentary, diagrammatic sectional view depicting a portion of a unit in accordance with a further embodiment of the invention.

Stair step routing within units can be used, for example in forming stacks of memory chips. A typical memory chip package of a type used without stair step routing is depicted in FIG. 14. Inter alia, the chip has 4 contacts, commonly referred to as DQ connections 101 and also has one or more clock connections 103. To make a 16 bit memory stack, five such chips are stacked on one another. DQ connections of the first four chips supply 4×4 or 16 separate connections for the 16 bits, whereas the fifth chip supplies four check bits. Each separate bit must be routed to a separate pad on a circuit panel. To make a 32-bit memory stack, ten such chips are stacked on one another. Two sets of five chips share a single set of five pads on the circuit panel, but are actuated with separate clock signals, achieved by bringing the clock pad 103 of five chips to one pad on the circuit panel and routing the same clock pad on another set of five chips to a different pad. Such a system can be made using three different packages or "tapes". The first tape, referred to as a "A" tape, has a first set of four pairs of traces. Each pair includes a trace 105A running to the left, and a trace 105B running to the right. Only one such pair, associated with DQ contact 101a, is depicted in FIG. 14 for clarity of illustration; the other pairs are similar. Each trace extends to a separate column position. By bonding pad 101A to trace 105A and the bonding the other DQ contacts to the other similar traces (not shown) running to the left side of the package (referred to as a "left bond-out"), the 4 DQ contacts can be connected to a set of four terminals at four column positions on the left side of the package. Alternatively, using the same tape, DQ contacts 101A can be bonded to trace 105B, and the other DQ contacts can be bonded to the other, similar traces (not shown) running to the right side of the package, so as to connect the four DQ contacts to terminals at a different set of four column positions along the right side of the package. Another tape, referred to as the B tape, is made with a different set of, such as traces 107A and 107B associated with contact 101A. Here again, four pairs of traces are provided, one for each DQ contact; each pair again includes a trace running to a column position on the left and a trace running to a column position on the right. These traces, however, extend to different column positions than the corresponding traces of the A tape. As with the A tape, the B tape can be connected with a left or right bond-out, so as to connect the four DQ contacts to terminals at either of two sets of column positions. Finally, a third tape, referred to as the C tape, is made with traces 109 and similar traces for the other DQ contacts, so that the DQ contacts can be routed to terminals at a fifth set of column positions, different from the column positions provided by the A and B tapes. All of these tapes have a set of two clock traces 111A and 111B allowing the routing of clock pad 103 to either of two column positions associated with either of two pads on the circuit board carrying the two different clock signals. The stacked package is made by assembling the various tapes with the various bond-outs in a stack, with direct or "normal" connections between terminals at the same column positions in all of the tapes, so that all of the terminals at any given column position are connected in a vertical conductive path. A This requires the circuit assembler to handle and stock three different tapes and a total of five different bond outs, i.e. tape A left bonding, tape A right bonding, tape B left bonding, tape B right bonding, tape C and all with clock contact 103 bonded to the appropriate trace 111A for clock 0 in order to make a 16-bit memory (5 units stacked). Making a 32-bit memory (10 units stacked) requires the same 3 tapes in and, and an additional set of five bond outs with clock pad 103 bonded to the clock trace 111B for clock 1. This poses significant logistical difficulties.

By contrast, using the approach shown in FIGS. 12 and 13, only a single tape and only a single bond out is required is required to make a five high stack (16 bit memory). The tape is provided with traces which connect each of the DQ pads 101 to a single terminal, at a single column position associated with that DQ pad. The interposer provides stair step routing at this column position, so that signals associated with this terminal on each of the five packages in the stack are routed to five different pads on the circuit board. A ten high stack (32 bit memory) can be made using the same approach, but with the clock contact 103 routed to either of two column positions using left or right bonding of clock traces as discussed above with reference to FIG. 14. In a further alternative, the clock contact on the chip can be routed to a single column position on all of the units, and the interposer can provide conductive paths which repeatedly cross one another as discussed below with reference to FIG. 16 so that the terminal at this column position is connected in a first conductive path carrying clock 0 at some units and in a second conductive path carrying clock 1 at other units. In this arrangement, only one bond-out is required for the entire assembly of a 32-bit memory.

A unit 230 according to a further embodiment of the invention includes a main substrate 202 and an interposer 206 similar to those discussed above. However, interposer 206 provides crossover routing similar to that discussed above with reference to FIGS. 7 and 8. Thus internal terminal 241-1 at a first column position is electrically connected through traces and vias to external terminal 240-2 at a second column position, whereas internal terminal 241-2 at the second column position is electrically connected to internal terminal 240-1 at the first column position. Thus, unit 230 as a whole provides a crossover routing so that top external terminal 238-1 at the first column position is connected to bottom external terminal 240-2 at the second column position, whereas top external terminal 238-2 at the second column position is connected to bottom external terminal 240-1 at the first column position. A unit according to this embodiment can be used in the assemblies discussed above with reference to FIGS. 1 through 11.

Figure 16:
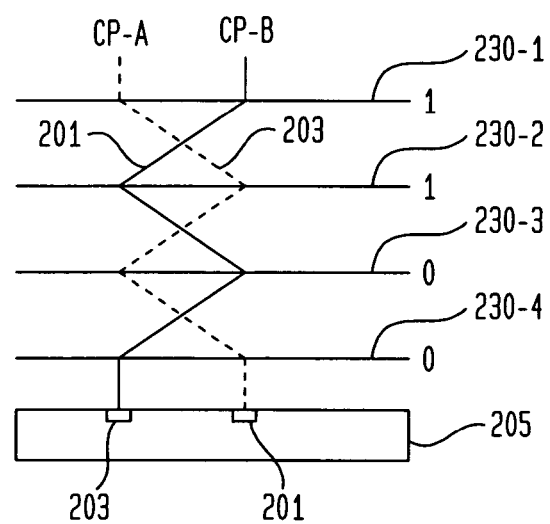
FIG. 16 is a diagrammatic elevational view depicting an assembly incorporating a plurality of units as shown in FIG. 15.

Alternatively, units made using an interposer with crossover routing can be used to minimize the number of separate tapes required for making a memory stack as discussed above. In this arrangement, the main substrate may be a tape with the same configuration as the A tape discussed above with reference to FIG. 14. The interposer is configured to reroute the signals from each column position CP-A associated with tape A to the corresponding column position CP-B associated with tape B, and vice-versa. However, there are no connections to the chip at the B column positions. The stacked units thus define crossing conductive paths 201 and 203 (FIG. 16). Unit 230-1 has one of its DQ contacts connected to path 203, whereas the next unit 230-2 has the same DQ contacts connected to conductive path 201. Unit 230-3 has the same DQ contact connected to path 203, whereas unit 230-4 has the same DQ contact connected to path 201. Thus, two DQ contacts are connected to each of these two conductive paths. The clocks in units 230-1 and 230-2 are connected to clock signal 1, whereas units 230-3 and unit 230-4 are connected to clock signal 0. Thus, four distinct bits are supplied through each of two paths 201 and 203 to circuit board 205. Two bits are supplied at each of the two clock signals. Tape C is still used to supply the check bits. As discussed above in connection with FIG. 13, crossing conductive paths of this type can be used to carry route two different clock signals to alternate units of a stack. This can be done by connecting a 0 clock connected to path 201 and a 1 clock to path 203 at circuit board 205, and by connecting the clock contact of the chip at each unit to the terminal at CP A in FIG. 16. To provide such crossing routing in conjunction with the stair-step routing for the DQ signals discussed with reference to FIG. 13, the same interposer can be made with stair-step routing at some column positions and with crossover routing at other column positions.

Figure 17:
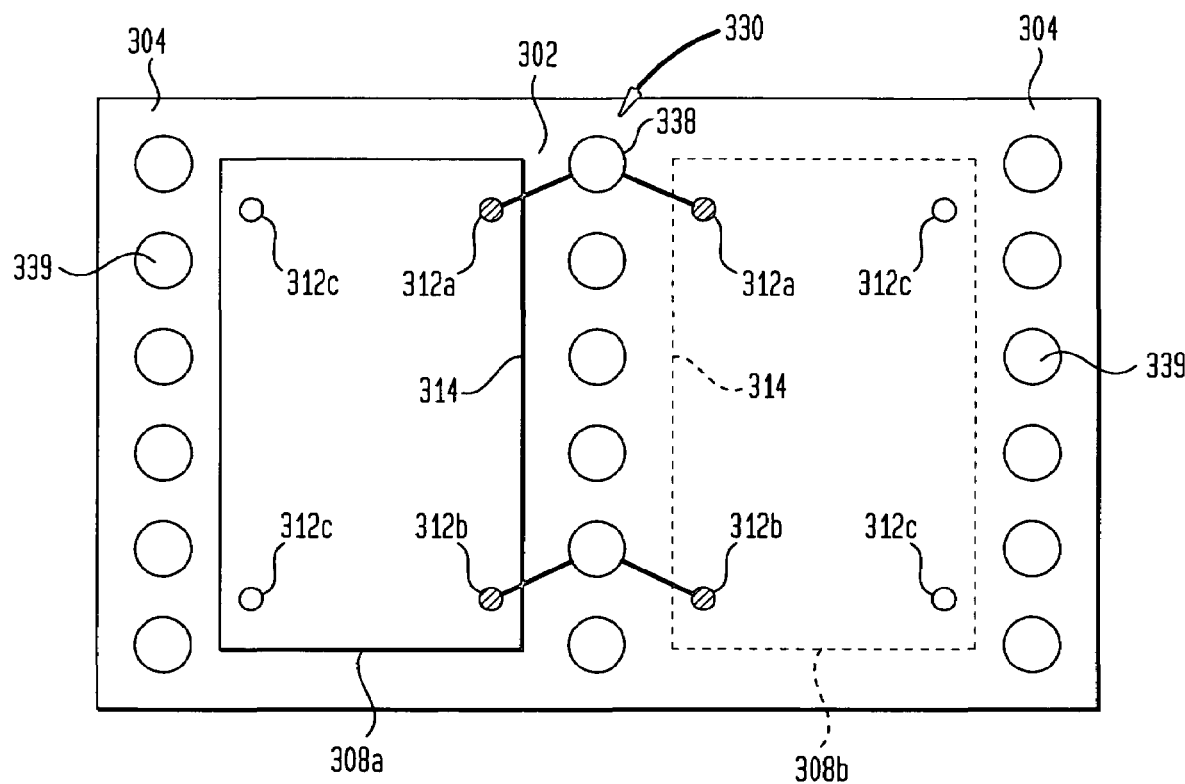
FIG. 17 is a diagrammatic top plan view depicting a unit in accordance with yet another embodiment of the invention.
Figure 18:
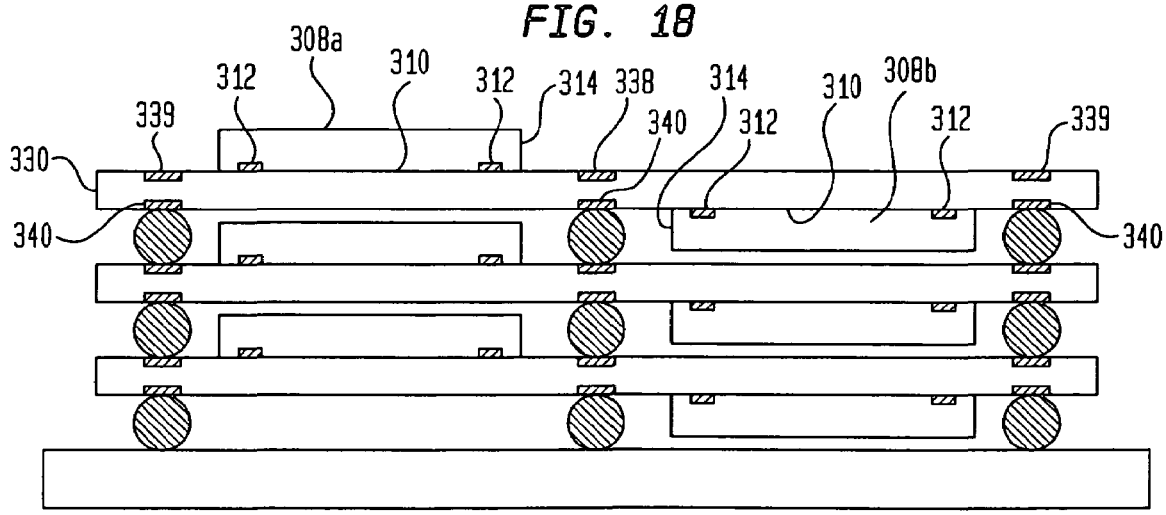
FIG. 18 is a diagrammatic elevational view depicting an assembly incorporating units as shown in FIG. 17.

A unit according to a further embodiment of the invention (FIG. 17) includes a structure such as a dielectric substrate 330 having an elongated, strip-like central region 302 and one or more rows of terminals, including top terminals 338 and bottom terminals 340 (FIG. 18) extending within the central region 302 of the substrate. The substrate also includes a pair of edge regions 304 and additional top terminals 339 and bottom terminals 340 disposed in these edge regions. Two microelectronic elements 308 are mounted to structure 330. Each microelectronic element has a contact-bearing surface 310 and contacts 312 exposed at such surface. The contacts include common contacts 312A and 312B (FIG. 17). These are disposed adjacent a first edge 314 of the front surface and hence adjacent the first edge of the microelectronic element. The contacts also include unique contacts 312C which may be disposed anywhere on the front surface. The microelectronic elements are mounted to the structure 330 on opposite sides of central region 302 and disposed so that the first edges 314 of both microelectronic elements lie adjacent the central region. Also, the same common contacts on both microelectronic elements are disposed adjacent the same end of the central region. For example, common contacts 312A on both elements 308 lie near one end of the central region 302 (close to the top of the drawing in FIG. 17, whereas common contacts 312B lie adjacent the opposite end of the central region, close to the bottom of the drawing in FIG. 17). In the embodiment shown in FIGS. 17 and 18, the microelectronic elements 308 are identical to one another. Thus, the desired placement of the contacts can be achieved by mounting one microelectronic element 308A to the top surface of structure 330 and the other microelectronic element 308B to the bottom surface of the structure. This arrangement provides a short, simple routing from the common contacts 312A, 312B to the terminals 338, 340 in the central region. As seen in FIG. 18, units of this type can be stacked. The microelectronic elements and the top surfaces of the various structures 330 aligned with one another and with the microelectronic element 308B on the bottom surfaces of the structure also aligned with one another. This arrangement does not materially increase the stack height.

In a further embodiment, microelectronic element 308B is made with a substantially identical function to element 308A but with contacts 312 disposed in a mirror image of the contact pattern on microelectronic element 308A. In this case, both microelectronic elements may be mounted on the top surface and still provide the desired contact arrangement as seen in FIG. 17. In yet another arrangement, the unit may include four microelectronic elements. Two identical units are mounted above and below the structure 330 on opposite sides of central region 302 in the manner illustrated in FIGS. 17 and 18, whereas two other microelectronic elements with a mirror image contact pattern are mounted above and below the structure, so that the second (mirror image) elements lie directly above and directly below the first elements.

As mentioned above, various types of conductive elements can be used to interconnect the terminals of the units with one another. For example, dielectric elements with pins are shown in U.S. Provisional Patent Applications 60/533, 210;60/533,393 and 60/533,437, all filed Dec. 30, 2003, the disclosures of which are incorporated by reference herein. The use of such pins as connecting elements in a stacked package is described in U.S. Provisional Patent Application 60/583,066, filed Jun. 25, 2004, and in the provisional patent application entitled Stacked Packages With Pin Conductors and Chip Select Elements, filed on or about Oct. 25, 2004, the disclosures of which are also incorporated by reference herein. Other forms of stacked packages using other types of pins are disclosed in PCT Published International Application WO2004/077525, the disclosure of which is also incorporated by reference herein.

Also, other features useful in stacked packages are disclosed in U.S. Published Patent Applications 20030107118 and 20040031972, the disclosures of which are also incorporated by reference herein. For example, these published applications describe features which can be incorporated into the units of a stacked package to allow selective making or breaking of traces in the individual units, to provide still further routing versatility. These features can be used in conjunction with the features discussed above.

Also, it should be appreciated that terms such as "top", "bottom", "up", "down" and the like as used in this disclosure refer to the frame of reference of the structure itself, and need not correspond to the normal gravitational frame of reference. Further, terminals and other conductive features are described herein as being "exposed at" certain surfaces of dielectric elements. As used in this disclosure, a conductive feature is "exposed at" a surface of a dielectric element if the conductive feature is accessible for contact with a point moving toward such surface from outside the dielectric element. Thus, a conductive feature exposed at a surface of a dielectric element may project from such surface; may be flush with such surface; or may be recessed below such surface in a hole or depression in such surface.

In the drawings, the vertical directions of the various components are shown as perpendicular to the horizontal directions. This is the most commonly used arrangement. However, a stack may have a sloping vertical direction, oblique to the horizontal planes of the unit substrates as, for example, where the conductive elements connecting terminals on adjacent unit substrate are canted. Also, the vertical direction may change slope at one or more places along the vertical extent of the stack, so that a "vertical" line zigags, as where alternate layers of conductive elements are canted in opposite directions. Any of these arrangements can be used.

As these and other objects, features and advantages of the present invention can be utilized without departing from the present invention, the foregoing description of the preferred embodiments should be taken by way of illustration rather than by way of limitation of the present invention.

The invention claimed is:

1. A microelectronic assembly comprising:
   (a) a circuit panel having top and bottom surfaces;
   (b) a plurality of units each including one or more microelectronic elements, each said unit having a top surface, a bottom surface and edges extending between said top and bottom surfaces, each said unit having terminals at column positions on at least one of said surfaces,
   said units being disposed in a plurality of stacks,
   each said stack including a plurality of said units superposed on one another in top-surface to bottom surface arrangement with the top surfaces of the units facing toward the top of the stack and with terminals at the same column positions in different units of the stack aligned with one another in columns extending upwardly and downwardly within the stack,
   said stacks being mounted to the circuit panel so that a first set of said stacks are disposed in a first orientation with the top surfaces of the units facing upwardly and a second set of said stacks are disposed in a second orientation with the top surfaces of the units facing downwardly, at least some of said stacks of said first set and at least some of said stacks of said second set being disposed side-by-side with one another.

2. The assembly as claimed in claim 1 wherein said units in each said stack are substantially identical to one another.

3. The assembly as claimed in claim 1 wherein each said stack has sides including a northerly side and a westerly side, the northerly side of each stack of said first set confronting the northerly side of a stack of said second set, the westerly side of each stack of said first set confronting the westerly side of a stack of the second set.

4. The assembly as claimed in claim 3 wherein at least some of the terminals at column positions on the northerly side of each stack of said first set are connected to terminals of the confronting northerly side of a stack of said second set, and wherein at least some of the terminals at column positions on the westerly side of each stack of said first set are connected to terminals of the confronting westerly side of a stack of said second set.

5. The assembly as claimed in claim 4 wherein said circuit panel has conductors thereon and at least some of said terminals of said stacks of said first and second sets are electrically connected to one another through said conductors on said circuit panel.

6. The assembly as claimed in claim 4 further comprising one or more interconnect interposers extending horizontally between said confronting sides of said stacks remote from said circuit panel, said interconnect interposer having conductors thereon, at least some of said terminals of said stacks of said first and second sets are electrically connected to one another through said conductors on said interconnect interposer.

7. The assembly as claimed in claim 6 wherein a portion of each said stack is disposed above said circuit panel and another portion of each said stack is disposed below said circuit panel, and wherein said one or more interconnect interposers include at least one top interconnect interposer disposed above said circuit panel and at least one bottom interconnect interposer disposed below said circuit panel.

8. A microelectronic assembly comprising:
   (a) a circuit panel;
   (b) a plurality of units each including one or more microelectronic elements, each said unit having a top surface, a bottom surface, each said unit having unit terminals on at least one of said surfaces,
   said units being disposed in a plurality of stacks including first and second stacks, each said stack including a plurality of said units superposed on one another in top-surface to bottom surface arrangement, at least some of the unit terminals on each unit being connected to at least some of the unit terminals on other units in the same stack, said stacks being mounted to said circuit panel; and
   (c) an interconnect interposer including a dielectric element and conductors, said interconnect interposer extending horizontally between said first and second stacks remote from said circuit panel, at least some unit terminals in a said first stack being electrically connected to at least some unit terminals in said second stack through said conductors of said interposer.

9. The assembly as claimed in claim 8 wherein each said unit includes a unit substrate having said unit terminals thereon, the at least one microelectronic element of each said unit being mounted to the unit substrate of such unit.

10. The assembly as claimed in claim 9 wherein said interconnect interposer extends between the unit substrates of adjacent units in said first stack and extends between the unit substrates of adjacent units in said second stack.

11. The assembly as claimed in claim 10 wherein each said unit substrate includes a central region and a peripheral region, and wherein the at least one microelectronic element of each said substrate is mounted in said central region, at least some of the terminals of each said unit being disposed in the peripheral region of the unit substrate, each said interconnect interposer extending between the peripheral regions of said unit substrates of said adjacent units but not between the central regions of those unit substrates.

12. The assembly as claimed in claim 11 wherein said dielectric element of said interconnect interposer includes a plurality of holes and border regions surrounding said holes and wherein each said interconnect interposer includes interposer terminals disposed on said border regions, the border regions being aligned with peripheral regions of said unit substrates of said adjacent units, said holes being aligned with the central regions of those unit substrates.

13. The assembly as claimed in claim 10 wherein said dielectric element of said interposer has oppositely-directed top and bottom surfaces, said interposer includes top interposer terminals exposed at the top surface of the dielectric element and bottom interposer terminals exposed at the bottom surface of the dielectric element, at least some of said bottom interposer terminals being electrically connected to at least some of said top interposer terminals, and wherein, in said first stack, unit terminals on one of said adjacent units are connected to unit terminals the other one of said adjacent units through said top and bottom interposer terminals.

14. The assembly as claimed in claim 13 wherein, in said first stack, said unit terminals, said top interposer terminals and said bottom interposer terminals are disposed at column positions such that terminals at the same column position are aligned with one another, and wherein at least some of said top interposer terminals are electrically connected to bottom interposer terminals at the same column position.

15. The assembly as claimed in claim 13 wherein, in said first stack, said unit terminals, said top interposer terminals and said bottom interposer terminals are disposed at column positions such that terminals at the same column position are aligned with one another, and wherein at least some of said top interposer terminals are electrically connected to bottom interposer terminals at the same column position.

16. A microelectronic assembly comprising:
(a) a stack including:
(i) an upper unit having first and second regions, said upper unit having downwardly facing unit terminals in said first region; and
(ii) a lower unit having first and second regions, said lower unit having upwardly facing unit terminals in said first region of said lower unit, said upper unit being disposed over said lower unit with said first regions of said upper and lower units aligned with one another and with said second regions of said upper and lower units aligned with one another; and
(b) an interposer extending between said first regions but not extending between said second regions, said interposer having interposer terminals thereon, at least some of said unit terminals of said upper unit being electrically connected to at least some of said unit terminals of said lower unit through said interposer terminals.

17. An assembly as claimed in claim 16 wherein said interposer has an upwardly-facing top surface and a downwardly-facing bottom surface, said interposer terminals include top interposer terminals exposed at the top surface of the interposer and bottom interposer terminals exposed at the bottom surface of the interposer, at least some of said top and bottom interposer terminals being electrically connected to one another, said unit terminals of said upper unit confronting said top interposer terminals, said unit terminals of said lower unit confronting said bottom interposer terminals.

18. An assembly as claimed in claim 17 further comprising electrically conductive elements extending between the unit terminals of at least one of said units and the interposer terminals confronting such unit terminals.

19. An assembly as claimed in claim 18 wherein said electrically conductive elements include lower conductive elements extending between the unit terminals of the lower unit and the bottom interposer terminals and upper conductive elements extending between the unit terminals of the upper unit and the top interposer terminals.

20. An assembly as claimed in claim 16 wherein said upper unit includes a upper unit substrate having the unit terminals of the upper unit thereon and at least one microelectronic element projecting downwardly from said upper unit substrate in said second region.

21. An assembly as claimed in claim 16 wherein said lower unit includes a lower unit substrate having the unit terminals of the lower unit thereon and at least one microelectronic element projecting upwardly from said unit substrate in said second region.

22. An assembly as claimed in claim 16 further comprising a circuit panel disposed below said lower unit, said stack being mounted to said circuit panel.

23. An assembly as claimed in claim 22 wherein said interposer projects out of said stack above said circuit panel.

24. An assembly as claimed in claim 23 further comprising an additional element mounted to said circuit panel horizontally offset from said stack, said interposer extending to said additional element and electrically connecting said stack and said additional element independently of said circuit panel.

25. A component for use in a microelectronic assembly, said component comprising:
(a) a structure including at least one dielectric element, said support structure having top and bottom surfaces extending in horizontal directions; and
(b) top unit terminals exposed at said top surface and bottom unit terminals exposed at said bottom surface, said top and bottom unit terminals being disposed at column positions such that top and bottom terminals disposed at the same column position are aligned with one another along an axis extending in a vertical direction transverse to said horizontal directions, said terminals including:
(i) a set of A terminals including an A top unit terminal at a first column position and an A bottom unit terminal at a second column position, said A terminals being electrically connected to one another; and
(ii) a set of B terminals including a B top unit terminal at said second column position and a B bottom unit terminal at said first column position, said B terminals being electrically connected to one another but not connected to said A terminals by any element of said substrate.

26. The component as claimed in claim 25 further wherein said vertical direction is perpendicular to said horizontal directions.

27. The component as claimed in claim 25 wherein said support structure includes a unitary dielectric element defining said top and bottom surfaces.

28. The component as claimed in claim 27 further comprising electrically conductive vias extending through said dielectric element, said A terminals being electrically connected to one said via, said B terminals being electrically connected to another said via.

29. The component as claimed in claim 25 wherein said support structure includes a main substrate including a main dielectric element having oppositely directed first and second surfaces and a swap substrate overlying at least a part of said second surface, said swap substrate having a first surface facing toward said main substrate and a second surface facing away from said main substrate, said first surface of said substrate constituting one of said top and bottom surfaces of said structure, said second surface of said swap substrate constituting the other one of said top and bottom surfaces.

30. The component as claimed in claim 29 wherein said swap substrate overlies only a part of said second surface.

31. A microelectronic unit including a component as claimed in claim 25 and a first microelectronic element mounted to said support structure, said first microelectronic element having contact pads electrically connected to at least some of said terminals, said contact pads including an A contact pad electrically connected to said A terminals.

32. The unit as claimed in claim 31 wherein said contact pads include and a B contact pad electrically connected to said B terminals.

33. The unit as claimed in claim 32 wherein said first microelectronic element is adapted to receive input signals through said B contact pad and is adapted to supply output signals through said A contact pad.

34. The unit as claimed in claim 33 wherein said first microelectronic element includes a semiconductor logic element.

35. The unit as claimed in claim 33 wherein said first microelectronic element includes an FPGA.

36. An assembly including first and second units as claimed in claim 31 superposed on one another in a stack with said first unit above said second unit, said bottom B terminal of said first unit being connected to the top A terminal of said second unit, said bottom A terminal of said first unit being connected to said top B terminal of said second unit.

37. An assembly including first, second, third and fourth units as claimed in claim 31 superposed on one another in a stack in numeric order with each lower-numbered unit above the next higher-numbered unit, said bottom B terminal of said first unit being connected to the top A terminal of said second unit, said bottom A terminal of said first unit being connected to said top B terminal of said second unit, said bottom B terminal of said third unit being connected to the top A terminal of said fourth unit, said bottom A terminal of said third unit being connected to said top B terminal of said fourth unit.

38. The assembly as claimed in claim 37 wherein the bottom A and B terminals of said second unit are not electrically connected within said stack to the top A and B terminals of said third unit.

39. The assembly as claimed in claim 37 further comprising a circuit panel extending within said stack between said second and third units, said circuit panel having an upper surface facing said second unit and a lower surface facing said third unit.

40. The assembly as claimed in claim 39 wherein said circuit panel has upper pads exposed at said upper surface of said circuit panel and lower pads exposed at said lower surface of said circuit panel, said upper pads including a first upper pad connected to the bottom B terminal of said second unit, a second upper pad connected to the bottom A terminal of said second unit, said lower pads including a first lower pad connected to the top A terminal of said third unit and a second lower pad connected to the top B terminal of said third unit.

41. The assembly as claimed in claim 40 wherein said top and bottom terminals of each said unit include:
  (i) a set of C terminals including a C top unit terminal at a third column position and a C bottom unit terminal at a fourth column position, said C terminals being electrically connected to one another; and
  (ii) a set of D terminals including a D top unit terminal at said fourth column position and a D bottom unit terminal at said third column position, said D terminals being electrically connected to one another,
  and wherein said upper pads of said circuit panel include a third upper pad connected to the bottom D terminal of said second unit and a fourth upper pad connected to the bottom C terminal of said second unit, said lower pads of said circuit panel including a third lower pad connected to the top C terminal of said third unit and a fourth lower pad connected to the top D terminal of said third unit.

42. The assembly as claimed in claim 41 wherein said upper and lower pads of said circuit panel are connected to one another as follows: first upper to third lower; second upper to fourth lower; third upper to first lower; and fourth upper to second lower, whereby the A terminals of each said unit are connected to the C terminals of another one of said units.

43. The assembly as claimed in claim 42 wherein said contact pads of said first microelectronic element in each said unit include C contact pads connected to the C terminals of such unit.

44. A microelectronic assembly comprising a plurality of units, each including at least one microelectronic element, each said unit having a top surface, a bottom surface and contacts exposed at said top and bottom surfaces, each said unit defining horizontal directions, said units being superposed on one another to form a stack having a vertical direction and having column positions such that each column position lies at the same horizontal location in each unit, at least some of said contacts on each unit are connected to one another to form conductive paths extending between said units, said conductive paths including at least one group of crossed paths, each said group of crossed paths including a first set of paths and a second set of paths such that in a first part of the stack the first set of paths extends at a first set of column positions and the second set of paths extends at a second set of column positions, whereas in a second part of the stack, above or below the first part of the stack, the first set of paths extends at said second set of column positions and the second set of paths extends at said column positions.

45. A microelectronic assembly comprising a plurality of units, each including at least one microelectronic element, each said unit having a top surface, a bottom surface and contacts exposed at said top and bottom surfaces, each said unit defining horizontal directions, said units being superposed on one another to form a stack having a vertical direction and having column positions such that each column position lies at the same horizontal location in each unit, at least some of said contacts on each unit are connected to one another to form conductive paths extending between said units, said conductive paths including at least one pair of crossed paths, each said pair of crossed paths including a first one of said paths and a second one of said paths, such that in a first part of the stack the first path extends at a first column position and the second path extends at a second column position, whereas in a second part of the stack, above or below the first part of the stack, the first path extends at said second column position and the second path extends at said first column position.

46. The assembly as claimed in claim 45 wherein each said unit includes a structure including at least one dielectric element, said at least one microelectronic element of each said unit being mounted to the structure of such unit, and wherein said terminals of each said unit include top unit terminals exposed at the top surface of the structure of such unit and bottom unit terminals exposed at the bottom surface of the structure of such unit.

47. A microelectronic assembly including:
  (a) a plurality of units, each having a structure including at least one dielectric element defining top and bottom surfaces and horizontal directions, each said structure having and terminals disposed at column positions such that each column position denotes a location in said horizontal directions, each said unit including a microelectronic element, the microelectronic elements of said units being substantially identical to one another, each said microelectronic element having contacts, at least some of said contacts being common contacts, at least some of said terminals on each said microelectronic element being common terminals electrically connected to said common contacts, said common terminals being disposed at the same column positions and connected to the same common contacts in each said unit,
  (b) a circuit panel having upper and lower surfaces and having horizontal directions, upper pads exposed at said upper surface and lower pads exposed at said lower surface, said pads including common pad pairs, each such common pad pair including one of said upper pads and one of said lower pads, the pads of each such pair being electrically connected to one another and substantially aligned with one another in the horizontal directions of said circuit panel;

said units being superposed on one another in a stack with a lower portion of the stack disposed below said circuit panel and an upper portion of the stack disposed above the circuit panel, the top surfaces of all of said units facing upwardly, said common terminals of all of the units being aligned with one another and with said common pairs of pads, the aligned common terminals and common pairs being connected to one another.

48. A stackable microelectronic unit comprising:
(a) a dielectric element having top and bottom surfaces, a central region, and first and second side regions disposed on opposite sides of said central region,
(b) terminals exposed at said top and bottom surfaces of said dielectric element, said terminals including at least one row of common terminals extending in said central region; and
(c) first and second substantially identical microelectronic elements, each said microelectronic element having a front surface and contacts exposed at said front surface, said contacts including common contacts and unique contacts, said front surface having a first edge, said first microelectronic element being mounted to said dielectric element on a first side of said central region with said front surface facing downwardly and said first edge adjacent said central region, said second microelectronic element being mounted to said dielectric element in said first side region with said front face facing downwardly and with said first edge adjacent said central region, said second microelectronic element being mounted to said dielectric element in said second side region with said front face facing upwardly and with said first edge adjacent said central region, at least some of said common contacts being connected to at least some of said common terminals.

49. A unit as claimed in claim 48 wherein said common contacts of each said microelectronic element are disposed adjacent the first edge of the front surface of such element.

50. A unit as claimed in claim 48 wherein said first microelectronic element overlies said top surface of said dielectric element and said second microelectronic element overlies said bottom surface of said dielectric element.

* * * * *

UNITED STATES PATENT AND TRADEMARK OFFICE
CERTIFICATE OF CORRECTION

| | | |
|---|---|---|
| PATENT NO. | : 7,183,643 B2 | Page 1 of 1 |
| APPLICATION NO. | : 10/981067 | |
| DATED | : February 27, 2007 | |
| INVENTOR(S) | : David Gibson and Andy Stavros | |

It is certified that error appears in the above-identified patent and that said Letters Patent is hereby corrected as shown below:

On the Title Page
    Item (57) Abstract, line 13, insert --as-- between "such" and "two";
    Item (57) Abstract, line 13, replace "cross" with --crossing--;

Insert the following heading and paragraph at Column 1, line 10, immediately above the heading: "FIELD OF THE INVENTION":

--                GOVERNMENT LICENSE RIGHTS

The U.S. Government has a paid-up license in this invention
        and the right in limited circumstances to require the patent
        owner to license others on reasonable terms as provided for by
        the terms of Contract No. F33615-03-M-4124 SBIR Phase I,
        awarded by the U.S. Air Force, Air Force Research Laboratory. --;

Column 4, line 20, replace "interposer" with --interposers--;
Column 8, line 43, replace "connect" with --connects--;
Column 11, line 25, replace "needs" with --need--;
Column 12, line 16, replace "ring-like structure" with --ring-like structures--;
Column 13, line 40, replace "a" with --an--;
Column 14, line 14, delete "A";
Column 14, line 21, delete "in and,";
Column 18, line 58, insert --on-- between "terminals" and "the";
Column 19, line 47, replace "a" with --an--;
Column 20, line 55, delete "and" between "include" and "a";
Column 22, line 49, delete "and" between "having" and "terminals".

Signed and Sealed this

Fourteenth Day of August, 2007

JON W. DUDAS
*Director of the United States Patent and Trademark Office*